(12) United States Patent
Juengling

(10) Patent No.: US 10,014,302 B1
(45) Date of Patent: Jul. 3, 2018

(54) METHODS OF FORMING MEMORY ARRAYS

(71) Applicant: Micron Technology, Inc., Boise, ID (US)

(72) Inventor: Werner Juengling, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/391,604

(22) Filed: Dec. 27, 2016

(51) Int. Cl.
   *H01L 27/108* (2006.01)

(52) U.S. Cl.
   CPC .. *H01L 27/10879* (2013.01); *H01L 27/10814* (2013.01); *H01L 27/10826* (2013.01); *H01L 27/10855* (2013.01); *H01L 27/10888* (2013.01); *H01L 27/10891* (2013.01)

(58) Field of Classification Search
   CPC ......... H01L 27/10879; H01L 27/10814; H01L 27/10888; H01L 27/10855; H01L 27/10826; H01L 27/10891; H01L 29/785; H01L 29/66795
   See application file for complete search history.

(56) References Cited

U.S. PATENT DOCUMENTS

| | | | |
|---|---|---|---|
| 8,741,758 B2 | 6/2014 | Juengling | |
| 2009/0206443 A1* | 8/2009 | Juengling | H01L 27/10876 257/506 |
| 2009/0237996 A1 | 9/2009 | Kirsch et al. | |
| 2009/0238000 A1* | 9/2009 | Juengling | H01L 27/10826 365/185.13 |
| 2009/0294842 A1* | 12/2009 | Juengling | H01L 21/3081 257/329 |
| 2011/0193157 A1 | 8/2011 | Juengling | |
| 2011/0223734 A1* | 9/2011 | Davis | H01L 21/3065 438/296 |
| 2011/0249488 A1* | 10/2011 | Juengling | H01L 27/105 365/149 |
| 2012/0086065 A1* | 4/2012 | Kim | H01L 27/108 257/306 |
| 2012/0126884 A1* | 5/2012 | Juengling | H01L 27/10826 327/581 |
| 2012/0126885 A1* | 5/2012 | Juengling | H01L 21/823431 327/581 |
| 2012/0329274 A1* | 12/2012 | Surthi | H01L 27/10885 438/656 |
| 2013/0049072 A1* | 2/2013 | Heineck | H01L 27/10876 257/202 |
| 2013/0049074 A1* | 2/2013 | Surthi | H01L 27/1052 257/208 |
| 2013/0146951 A1* | 6/2013 | Jeungling | H01L 27/10802 257/288 |
| 2014/0185355 A1 | 7/2014 | Juengling | |

* cited by examiner

*Primary Examiner* — Bitew Dinke
(74) *Attorney, Agent, or Firm* — Wells St. John P.S.

(57) ABSTRACT

Some embodiments include a method of forming a memory array. A wordline is formed to extend along a first direction, and along a rail of semiconductor material. After the wordline is formed, the rail is patterned into fins. Each fin has a first pedestal, a second pedestal, and a trough between the first and second pedestals. Charge-storage devices are formed to be electrically coupled with the first pedestals. Digit lines are formed to be electrically coupled with the second pedestals. Some embodiments include apparatuses containing finFETs.

19 Claims, 21 Drawing Sheets

US 10,014,302 B1

METHODS OF FORMING MEMORY ARRAYS

TECHNICAL FIELD

Memory devices, and methods of forming memory devices.

BACKGROUND

Fin field effect transistors (finFETs) may be incorporated into integrated circuitry. The finFETs include a fin (a tall thin semiconductor member) extending generally perpendicularly from a substrate. The fin comprises a pair of opposing sidewalls, and gate material is provided along at least one of the sidewalls. The gate material is spaced from said at least one of the sidewalls by gate dielectric material. A pair of source/drain regions is provided within the fin, and a channel region extends between the source/drain regions. In operation, the gate is utilized to selectively control current flow within the channel region.

The finFETs may be utilized as access transistors in integrated memory arrays; such as, for example, dynamic random access memory (DRAM) arrays. In some applications the finFETs may be incorporated into crosshair memory cells. In such applications the source/drain regions are on a pair of upwardly-projecting pedestals, and the channel region is along a trough extending between the pedestals. A charge-storage device (for instance, a capacitor) is electrically coupled with one of the source/drain regions, and a digit line is electrically coupled with the other of the source/drain regions. The gate is beneath the source/drain regions, and extends along the trough comprising the channel region. Example finFET structures, and example crosshair memory cells, are described in U.S. Pat. No. 8,741,758, and U.S. patent publication numbers 2009/0237996 and 2011/0193157.

It is desired to develop improved methods of fabricating architectures comprising finFET devices.

BRIEF DESCRIPTION OF THE DRAWINGS

FIGS. 11, 13, 15 and 17 are diagrammatic cross-sectional side views along the same plane as the cross-section X-X of FIG. 1. FIGS. 12, 14, 16 and 18 are top views of the construction at the process stages of FIGS. 11, 13, 15 and 17, respectively.

DETAILED DESCRIPTION OF THE ILLUSTRATED EMBODIMENTS

Figure 1:
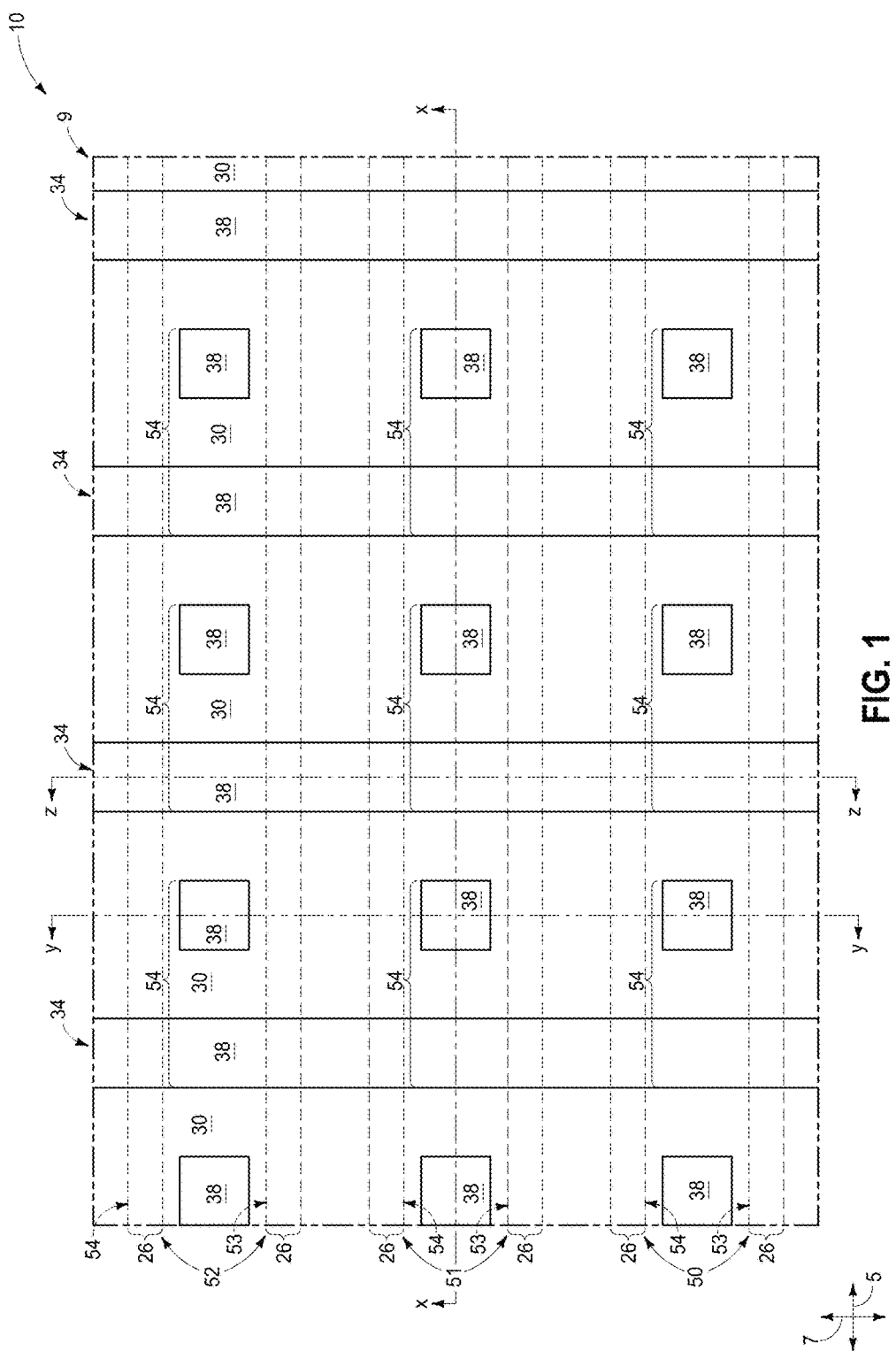
FIGS. 1-4 are a diagrammatic top view and diagrammatic cross-sectional side views of a region of an example memory array. The view of FIG. 2 is along the line X-X of FIG. 1; the view of FIG. 3 is along the line Y-Y of FIG. 1; the view of FIG. 4 is along the line Z-Z of FIG. 1; and the view of FIG. 1 is along the line T-T of FIGS. 2-4.

A difficulty that may occur during fabrication of finFETs is that the tall thin fins may topple if not adequately supported. Some embodiments described herein fabricate wordlines along rails of semiconductor material prior to patterning fins from the rails. The wordlines may provide support as the fins are formed from the rails, which may avoid toppling problems associated with some conventional processes. These and other aspects are described with reference to example embodiments of FIGS. 1-18.

A portion of an example memory array 9 is diagrammatically illustrated in FIGS. 1-4 as part of a construction 10. The memory array includes a plurality of finFET transistors 12 (labeled in FIG. 2) arranged in rows and columns. Each finFET transistor includes a fin 14 of semiconductor material 16. The fins 14 extend upwardly from a substrate 18.

The substrate 18 may comprise semiconductor material; and may, for example, comprise, consist essentially of, or consist of monocrystalline silicon. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications the substrate 18 may correspond to a semiconductor substrate containing one or more materials associated with integrated circuit fabrication. Such materials may include, for example, one or more of refractory metal materials, barrier materials, diffusion materials, insulator materials, etc. The substrate 18 is illustrated to be spaced from fins 14 to indicate that there may be circuitry, materials, levels, etc. (not shown) between the substrate and the fins in some embodiments.

The semiconductor material 16 of fins 14 may comprise any suitable semiconductor material, and in some embodiments may comprise, consist essentially of, or consist of silicon.

The fins 14 are shown to comprise a pair of upwardly-extending pedestals 20 and 22, and to have a trough (i.e., valley) 24 between the pedestals 20/22. In the illustrated embodiment the pedestal 22 is shorter than the pedestal 20 (or in other words, is recessed relative to the pedestal 20). In some embodiments the pedestal 20 may be considered to extend to a first height over substrate 18, and the pedestal 22 may be considered to extend to a second height over substrate 18 which is less than the first height. The pedestals 20 may be referred to as first pedestals, and the pedestals 22 may be referred to as second pedestals.

Figure 2:
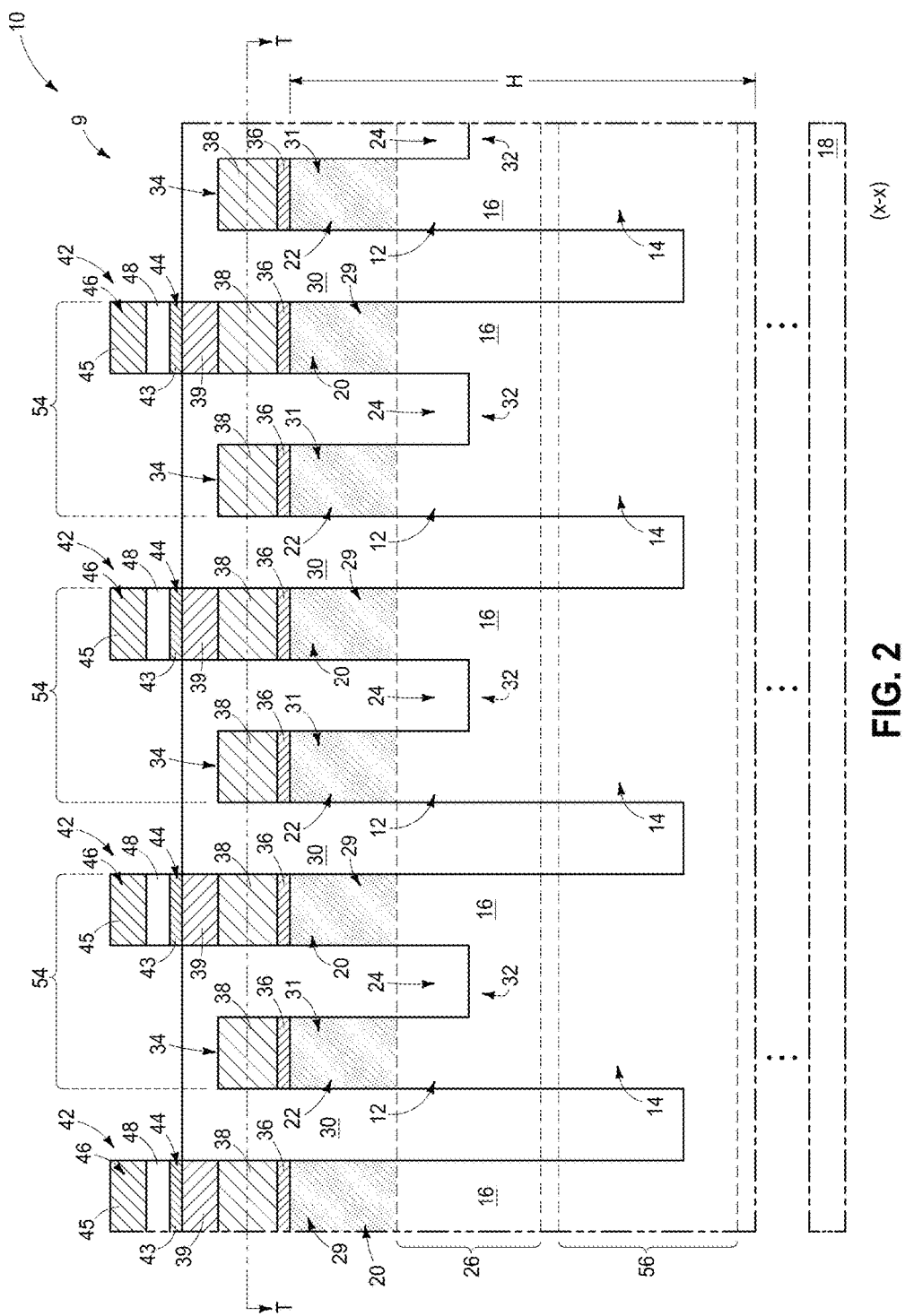
Figure 3:
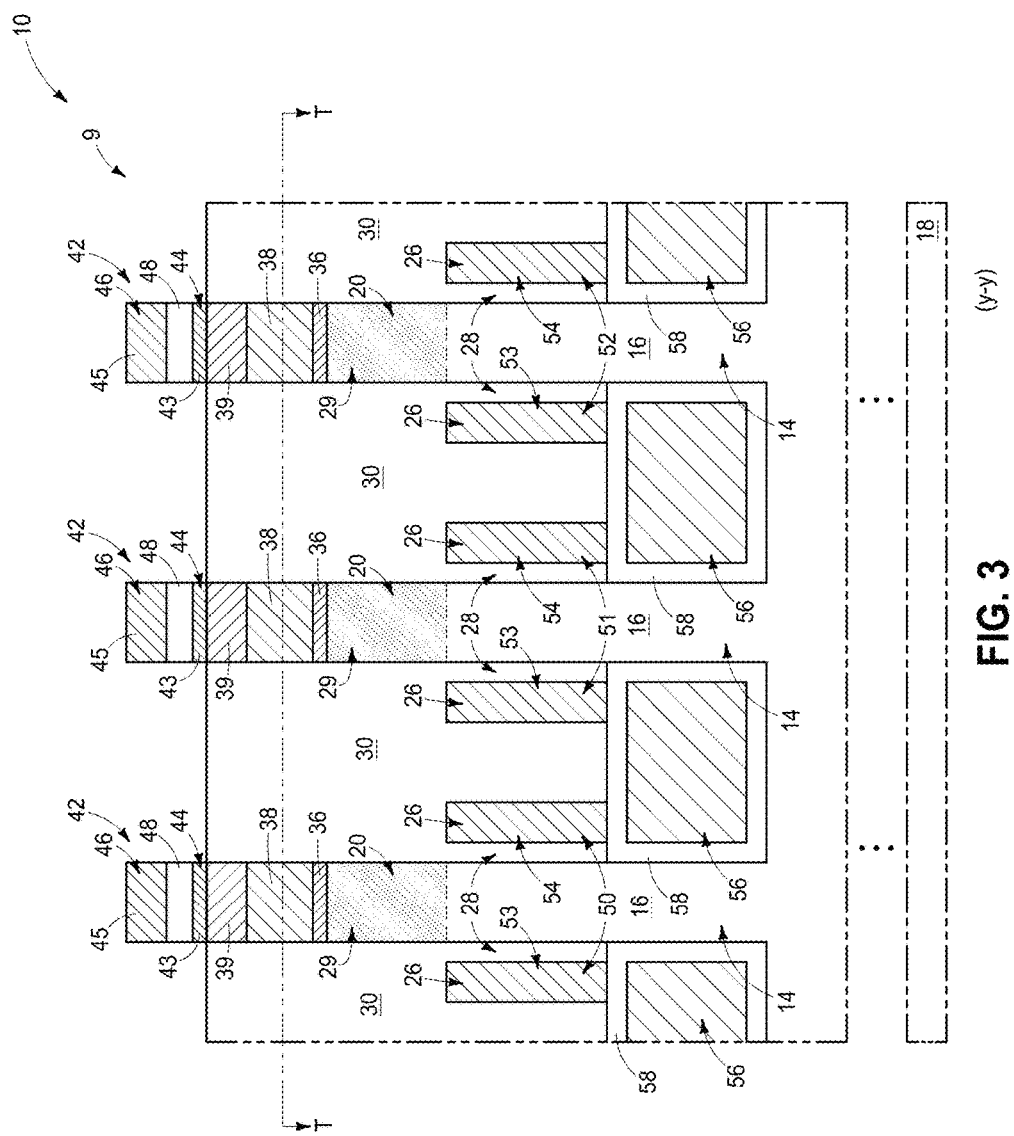
Figure 4:
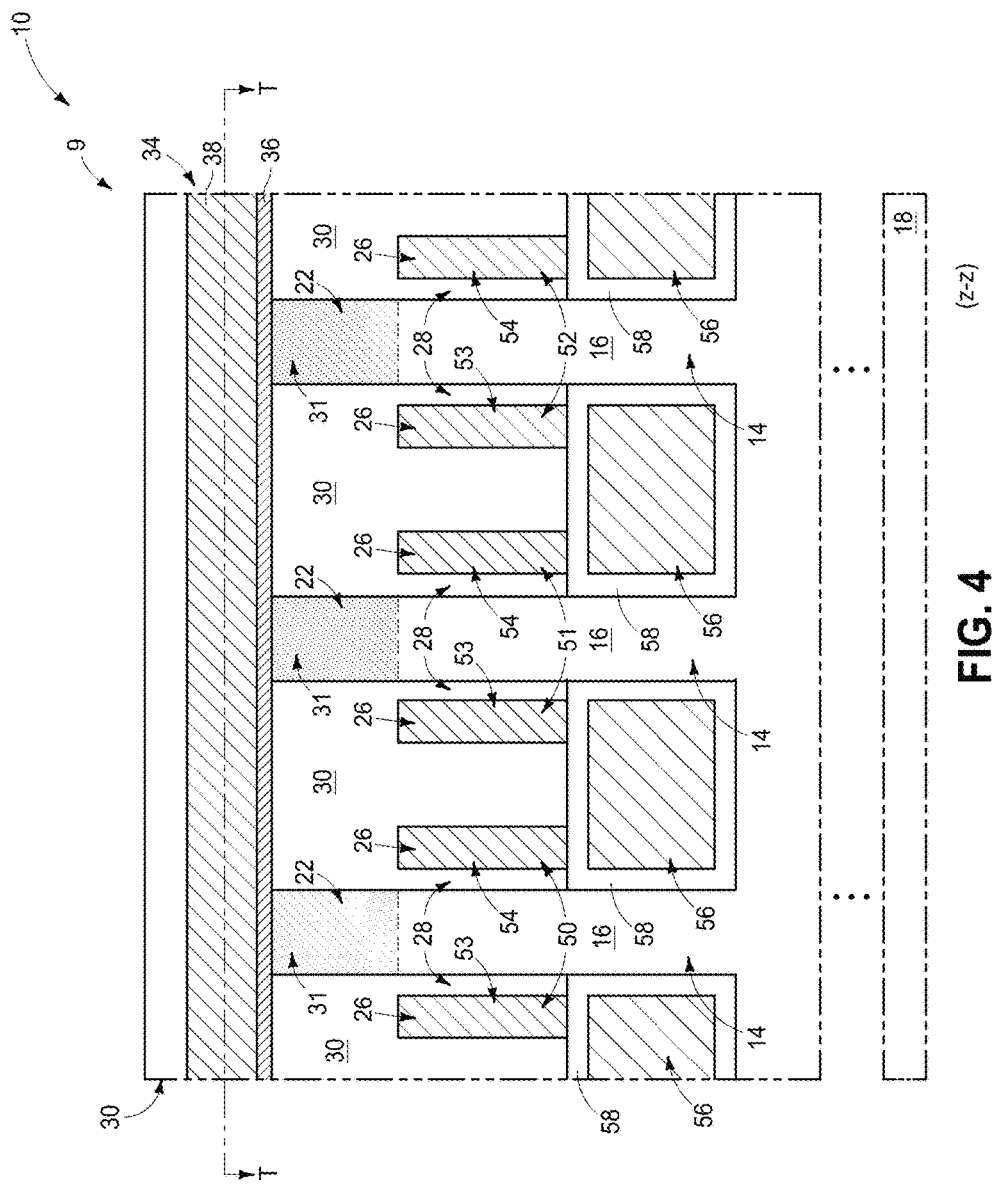

The pedestals 20/22 may have any suitable width dimensions along the cross-sections of FIGS. 2-4; including, for example, F/2, F/4, etc., where F is a minimum feature size of a photolithographic process utilized during fabrication of the pedestals 20/22.

Upper regions of the pedestals 20/22 may be heavily doped with n-type dopant to form first source/drain regions 29 (indicated with stippling) within the first pedestals 20, and to form second source/drain regions 31 (indicated with stippling) within the second pedestals 22. Although the finFET transistors 12 are described as being n-type devices (i.e., are described as comprising n-type doped source/drain regions 29/31); in other embodiments the finFET transistors 12 may be p-type devices comprising p-type doped source/drain regions.

Lower regions of fins 14 may be intrinsically doped; and the intrinsic dopant level may correspond to a dopant level of less than or equal to about $10^{15}$ atoms/cm$^3$. In some embodiments the lower regions of the fins may have p-dopant levels, with such dopant levels corresponding to less than or equal to about $10^{16}$ atoms/cm$^3$.

Wordlines 26 extend along sidewalls of the fins 14, and are spaced from such sidewalls by gate dielectric material 28. The wordlines 26 and gate dielectric material 28 are shown in FIGS. 3 and 4. A wordline 26 is also diagrammatically illustrated in FIG. 2 in dashed-line (i.e., phantom) view, since the wordline is out of the plane relative to the view of FIG. 2 (i.e., is in front of the plane). Wordlines 26 are also diagrammatically illustrated in FIG. 1 in dashed-line (i.e., phantom) view, since the wordlines are below the plane of the FIG. 1 view. The wordlines extend along a first direction, with such first direction being along an axis 5 shown adjacent the top view of FIG. 1.

The wordlines may comprise any suitable electrically conductive materials, such as, for example, one or more of various metals (e.g., tungsten, titanium, cobalt, nickel, platinum, etc.), metal-containing compositions (e.g., metal silicide, metal nitride, metal carbide, etc.), and/or conductively-doped semiconductor materials (e.g., conductively-doped silicon, conductively-doped germanium, etc.).

The wordlines 26 may have any suitable width dimension along the cross-sections of FIGS. 3 and 4; including, for example, F/2, F/4, F/6, etc., where F is a minimum feature size of a photolithographic process utilized during fabrication of the wordlines 26.

The gate dielectric material 28 may comprise any suitable electrically insulative material, such as, for example, silicon dioxide. In the shown embodiment the gate dielectric material 28 merges with other dielectric material 30 that surrounds the fins 14 and other structures (for instance, wordlines 26). Such implies that the gate dielectric material 28 comprises a common composition as the other dielectric material 30. In other embodiments the gate dielectric material 28 may comprise a different composition than at least some of the remaining dielectric material 30. Further, although the dielectric material 30 is illustrated to be a single homogeneous composition, in other embodiments the dielectric material 30 may comprise two or more different compositions.

The wordlines 26 comprise gates of the finFET transistors 12. In the illustrated embodiment each finFET transistor 12 has a pair of gates which are along opposing sidewalls of the fin 14. In other words, each finFET transistor 12 comprises a fin 14 between paired wordlines 26. The wordline pairs are labeled as pairs 50-52. Each wordline pair may be considered to comprise a first wordline 53 and a second wordline 54. In some embodiments the paired wordlines (e.g., wordline pairs 50-52) may be each replaced with a single wordline which extends along only one of the sidewalls of the fin 14.

The finFET transistors 12 may be each considered to comprise the pair of source/drain regions 29 and 31, and to comprise a channel region 32 extending between the source/drain regions. The channel regions may comprise threshold voltage (VT) doping (not shown). Current flow along the channel regions is selectively activated by selectively energizing particular wordline pairs (e.g., activating one of the wordline pairs 50-52). The wordlines 26 may be vertically spaced from the heavily-doped source/drain regions 29/31, and there may be lightly-doped extension regions provided between the heavily-doped source/drain regions and the gates. The lightly-doped extension regions may be implanted regions and/or may form operationally during operation of gated devices.

In the illustrated embodiment the wordlines 26 are over conductive beams 56, and are spaced from the conductive beams 56 by dielectric material 58. The conductive beams may comprise any suitable electrically conductive material; and in some embodiments may comprise, consist essentially of, or consist of conductively-doped semiconductor material (e.g., conductively-doped silicon). The dielectric material 58 may comprise any suitable composition or combination of compositions; including, for example, one or more of silicon nitride, silicon dioxide, etc. The dielectric material 58 may be a single homogeneous composition, or may comprise two or more different compositions.

In some embodiments the wordlines 26 comprise metal and correspond to active wordlines utilized for selectively activating the finFET transistors 12. In contrast, the beams 56 consist of conductively-doped semiconductor and may be passive in that they are not utilized for activating the finFET transistors 12. Instead the beams 56 may be utilized primarily to reduce crosstalk (e.g., row-hammer disturb) between adjacent finFET transistors during operation of memory array 9. In some embodiments the beams 56 may be omitted.

Digit lines 34 are electrically coupled with the second source/drain regions 31 of the finFET transistors 12. The digit lines extend along a second direction, with the second direction being along an axis 7 shown adjacent the top view of FIG. 1. In the shown embodiment the second direction of the digit lines 34 is substantially orthogonal to the first direction of the wordlines 26; with the term "substantially orthogonal" meaning orthogonal to within reasonable tolerances of fabrication and measurement. The digit lines may extend along columns of the memory array 9, and the wordlines may extend along rows of such memory array. In some embodiments the second direction of the digit lines 34 may be referred to as a column direction and the first direction of the wordlines 26 may be referred to as a row direction.

The digit lines 34 comprise electrically conductive materials 36 and 38. Although the digit lines 34 are shown comprising two materials, it is to be understood that the digit lines may comprise any number of suitable materials. Accordingly, the digit lines 34 may comprise only a single material in some embodiments, and may comprise more than two materials in some embodiments.

In some embodiments the electrically conductive material 36 corresponds to conductively-doped semiconductor material (for instance, n-type doped silicon) and the conductive material 38 corresponds to metal (e.g., titanium, tungsten, etc.) and/or one or more metal-containing compositions (e.g., metal silicide, metal nitride, metal carbide, etc.). For instance, the material 38 may comprise metal silicide (for instance, titanium silicide) over material 36, and may comprise one or both of titanium and titanium nitride over the titanium silicide. For instance, in some embodiments the digit lines may comprise, in ascending order from upper surfaces of source/drain regions 31, conductively-doped silicon, titanium silicide, titanium and titanium nitride.

It may be advantageous for the digit lines to comprise metal-containing material (i.e., pure metal and/or metal-containing compositions) in that such may enable the digit lines to have low resistance. Any suitable metal-containing materials may be utilized, including, for example, materials comprising one or more of titanium, cobalt, nickel and platinum. The metal-containing materials may be provided over conductively-doped silicon (e.g., material 36 of the illustrated embodiment), with the conductively-doped silicon being utilized to achieve desired electrical contact and adhesion with the source/drain regions 31.

Charge-storage devices 42 are electrically coupled with the first source/drain regions 29. In the illustrated embodiment the charge-storage devices 42 are electrically coupled to the source/drain regions 29 through the same conductive materials 36 and 38 as are utilized in digit lines 34, as well as through an additional conductive material 39 provided over conductive material 38. The conductive material 39 may comprise any suitable composition or combination of compositions; and in some embodiments may comprise, consist essentially of, or consist of conductively-doped silicon.

The charge-storage devices 42 may be capacitors or any other structures suitable for reversibly storing charge. In the illustrated embodiment the charge-storage devices 42 correspond to capacitors. The capacitors have first and second nodes 44 and 46, and capacitor dielectric material 48 between the first and second nodes. In the illustrated embodiment the first and second nodes 44 and 46 are shaped as plates, and the capacitor dielectric material 48 is a thin film provided between such plates. The capacitors may have other configurations in other embodiments.

The nodes 44 and 46 comprise conductive electrode materials 43 and 45, respectively. The conductive electrode materials 43 and 45 may comprise any suitable electrically conductive materials or combinations of materials; and in some embodiments may comprise, consist essentially of, or consist of one or more metals (for instance, titanium, platinum, etc.), metal-containing compositions (for instance, metal nitrides, metal silicides, alloys of two or more metals, etc.) and/or conductively-doped semiconductor materials (for instance, conductively-doped silicon, conductively-doped germanium, etc.). The conductive electrode materials 43 and 45 may be the same composition as one another, or may be different compositions relative to one another.

The capacitor dielectric material 48 may comprise any suitable composition or combination of compositions; including, for example, ferroelectric material and/or non-ferroelectric material. In some embodiments the capacitor dielectric material 48 may comprise, consist essentially of, or consist of one or more of silicon dioxide, silicon nitride, aluminum oxide, etc. In some embodiments the material 48 may be an insulative material comprising, consisting essentially of, or consisting of one or more materials selected from the group consisting of transition metal oxide, zirconium, zirconium oxide, hafnium, hafnium oxide, lead zirconium titanate, tantalum oxide, and barium strontium titanate; and having dopant therein which comprises one or more of silicon, aluminum, lanthanum, yttrium, erbium, calcium, magnesium, niobium, strontium, and a rare earth element.

The combination of an access transistor (i.e., finFET transistor) 12 with a charge-storage device (e.g., capacitor) 42 forms a memory cell 54, with a charge state of the charge-storage device 42 corresponding to a memory state of the memory cell 54. The memory cells are arranged in rows and columns across the memory array 9. The wordlines 26 extend along rows of the memory cells 54 within the memory array 9, and the digit lines 34 extend along columns of the memory cells 54 within the memory array 9.

An example method for fabricating the memory array 9 of FIGS. 1-4 is described with reference to FIGS. 5-18.

Figure 5:
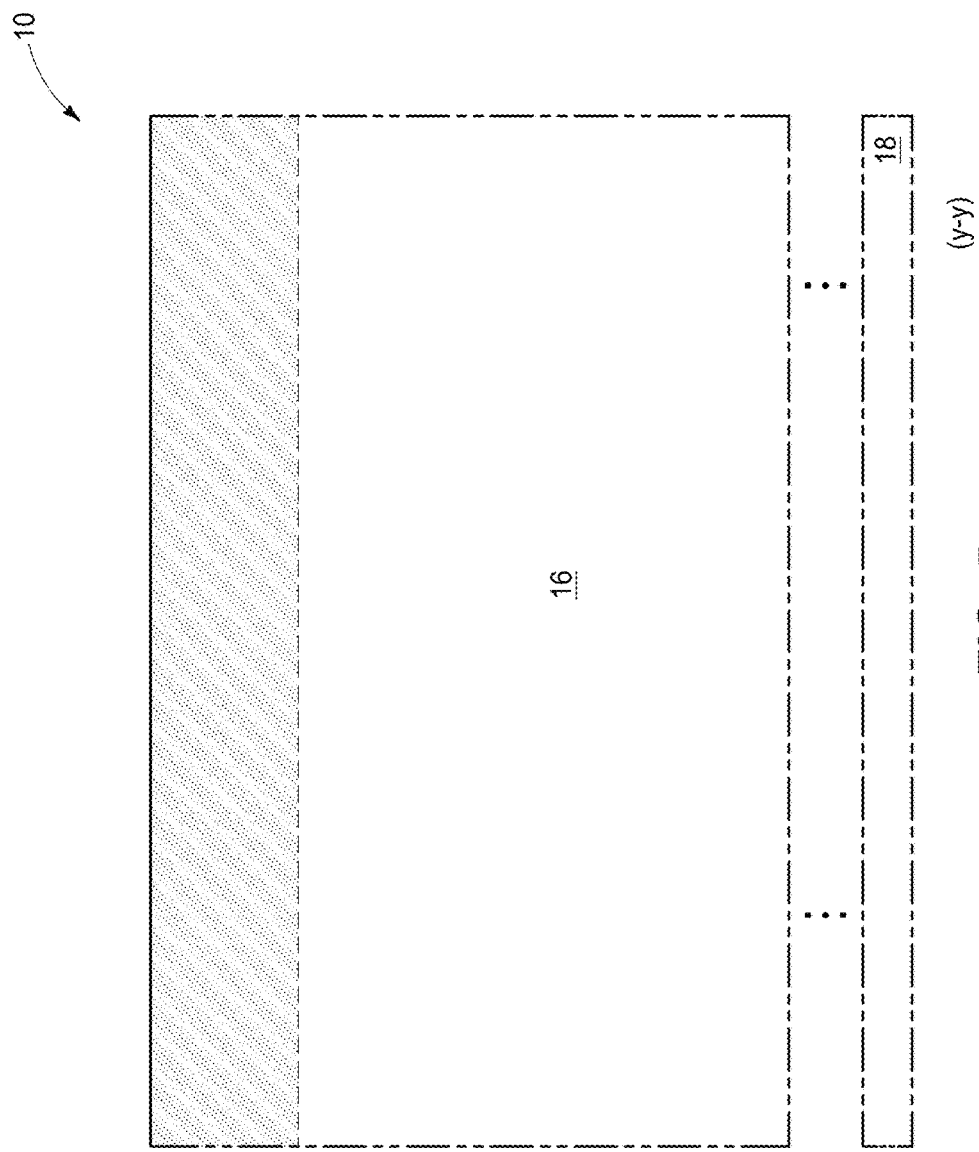
FIGS. 5-9 are diagrammatic cross-sectional side views of a construction at various stages of an example method of forming a memory array. The cross-sections of FIGS. 5-9 are along the same plane as the cross-section Y-Y of FIG. 1.

Referring to FIG. 5, construction 10 is shown at a processing stage in which the construction includes a block of semiconductor material 16. FIG. 5 is a view along the plane Y-Y of FIG. 1 (i.e., the same plane as FIG. 3). The semiconductor material 16 may comprise, for example, silicon; and may be in any suitable form, such as, for example, monocrystalline silicon. The semiconductor material 16 may be doped at the processing stage of FIG. 5. For instance, an upper region of the semiconductor material 16 may be heavily doped so that the heavily-doped source/drain regions 29/31 may be eventually patterned from such upper region (with the heavily-doped upper region being indicated with stippling). Other dopants (for instance, threshold voltage dopants) also may be provided at the processing stage of FIG. 5.

Figure 6:
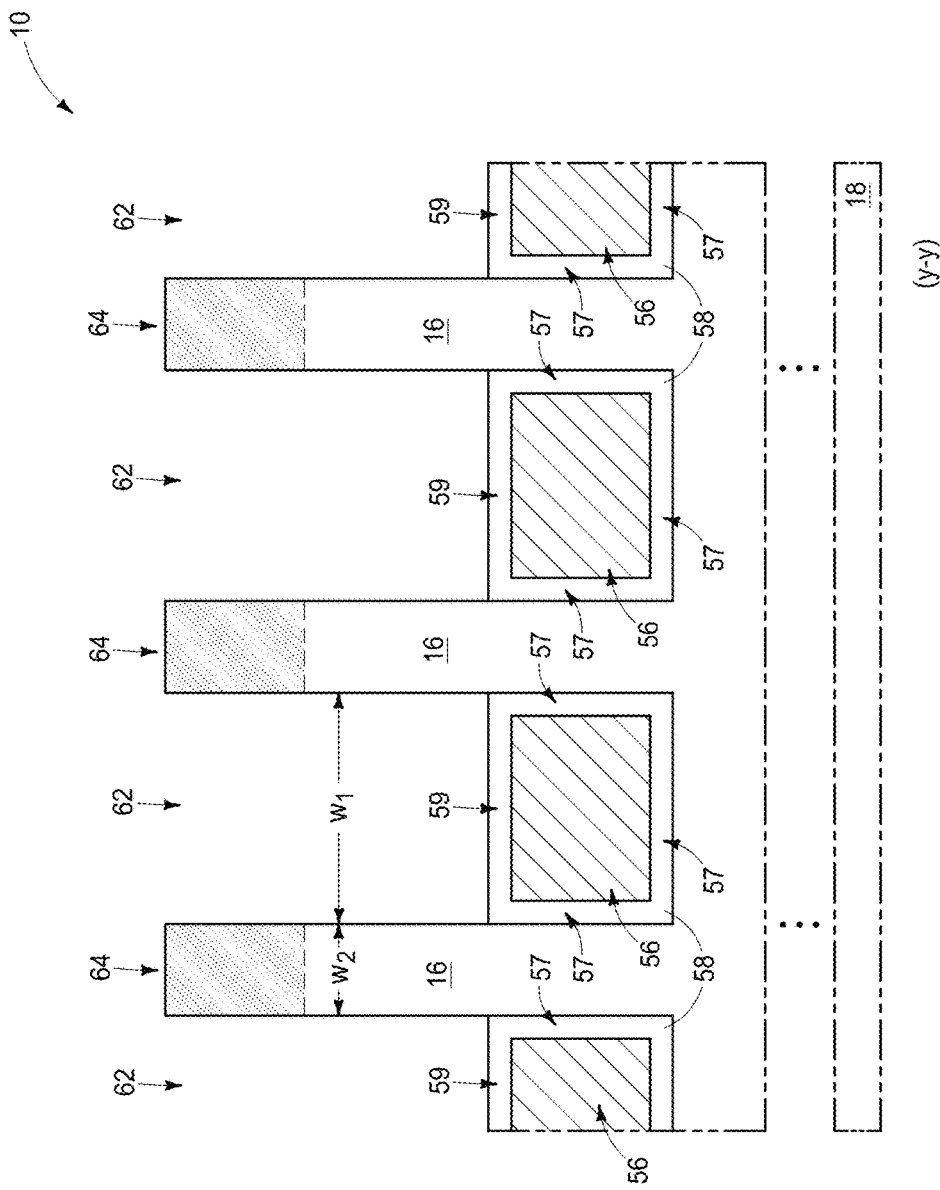

Referring to FIG. 6, trenches 62 are formed within the semiconductor material 16. The trenches 62 extend in and out of the page relative to the view of FIG. 6, and may be formed utilizing any suitable methodology. For instance, a patterned mask (not shown) may be formed over material 16 to define locations of the trenches 62, and then the trenches 62 may be formed with one or more suitable etches.

The formation of trenches 62 patterns the semiconductor material 16 into a plurality of rails 64 between the trenches, with the rails 64 extending in and out of the page relative to the view of FIG. 6.

The trenches 62 have widths $W_1$ and the rails 64 have widths $W_2$. The widths $W_1$ and $W_2$ may be formed to any suitable dimensions. For instance, in some embodiments a lithographic process utilized during fabrication of the trenches 62 will have a minimum feature size "F". In such embodiments the widths $W_2$ may be, for example, F/2, F/4, F/6, etc.; and the widths $W_1$ may be, for example, 3F/2, 3F/4, etc.

Conductive beams 56 are formed within the bottoms of the trenches 62 (with such conductive beams extending in and out of the page relative to the view of FIG. 6), and dielectric material 58 is formed around the beams 56. In some embodiments a first portion 57 of the dielectric material 58 may be formed by oxidizing exposed surfaces of semiconductor material 16, and then the conductive beams 56 may be formed within a container defined by such first portion 57 of the dielectric material 58. Subsequently, a second portion 59 of the dielectric material 58 may be formed over the conductive beams 56 by oxidizing upper surfaces of the conductive beams 56. The first portions 57 and second portions 59 of dielectric material 58 may be the same composition as one another if the semiconductor material 16 is the same as semiconductor material of beams 56 (for instance, the portions 57 and 59 may comprise, consist essentially of, or consist of silicon dioxide if semiconductor material 16 comprises silicon and the beams 56 also comprise silicon). In other embodiments, the first and second portions 57 and 59 of dielectric material 58 may be different compositions from one another if the semiconductor material 16 is different from the material of beams 56. In some embodiments, one or both of the portions 57/59 of dielectric material 58 may be deposited rather than oxidatively grown.

Figure 7:
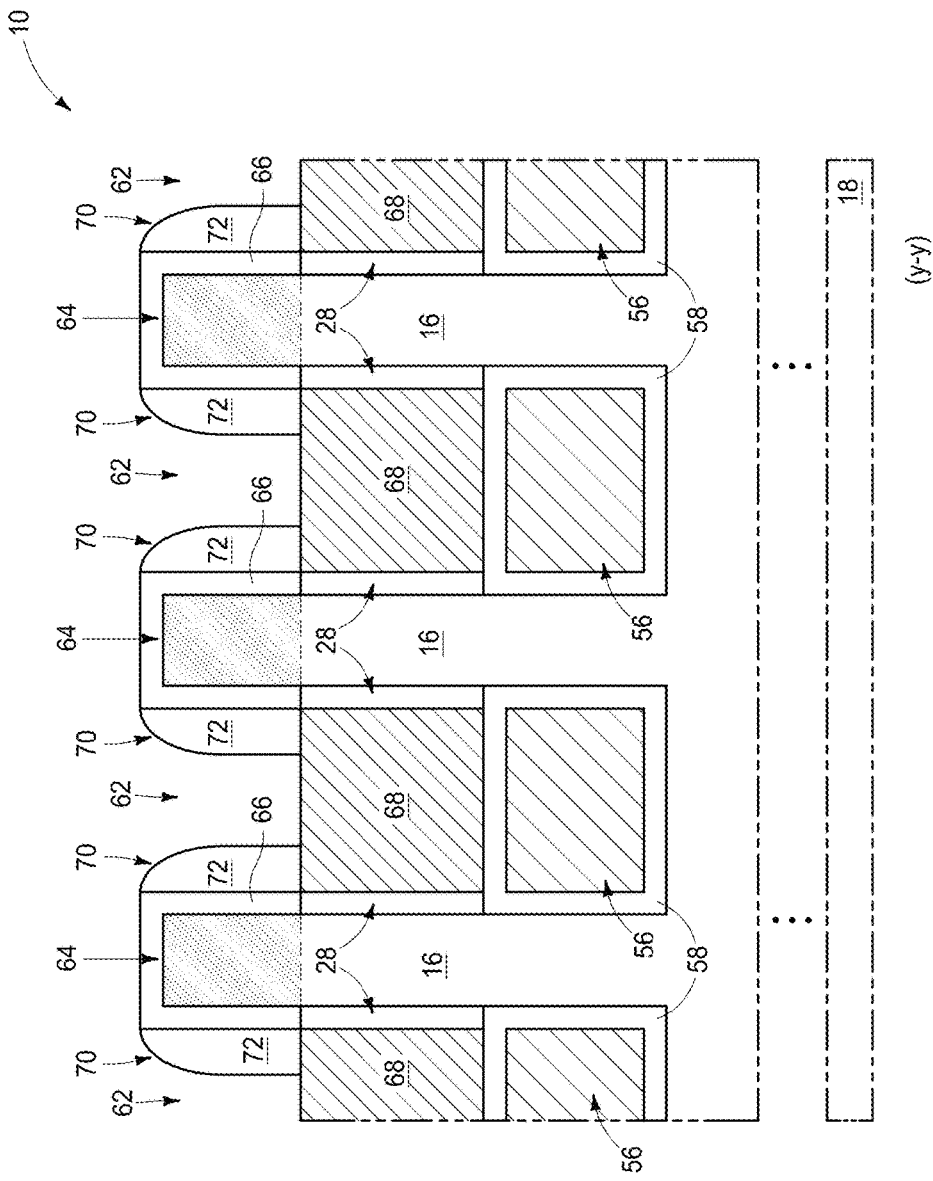

Referring to FIG. 7, dielectric material 66 (which includes the gate dielectric material 28 in the shown embodiment) is formed along exposed sidewalls of rails 16, and then wordline material 68 is formed within the trenches 62 and along the dielectric material 66, and specifically along the gate dielectric material 28.

In some embodiments the dielectric material 66 may comprise silicon dioxide, and may be grown by oxidizing exposed surfaces of the rails 64. Lower regions of the dielectric material 66 correspond to the gate dielectric material 28; and in some embodiments the gate dielectric material 28 may comprise, consist essentially of, or consist of silicon dioxide. The dielectric material 66 may comprise a same composition as dielectric material 58, or may comprise a different composition relative to dielectric material 58.

The wordline material 68 may comprise any suitable composition or combination of compositions; and in some embodiments may comprise metal (e.g., titanium, titanium nitride, tungsten, tungsten nitride, etc.).

Spacer material 72 is formed within the trenches 62 and is patterned into spacers 70. The spacer material 72 may comprise any suitable composition or combination of compositions; and in some embodiments may comprise, consist essentially of, or consist of silicon nitride. The spacer material 72 may be patterned into the spacers 70 with any suitable processing. For instance, in some embodiments the spacer material 72 may be formed conformally across an upper surface of construction 10 and then subjected to anisotropic etching to form the illustrated spacers 70.

Figure 8:
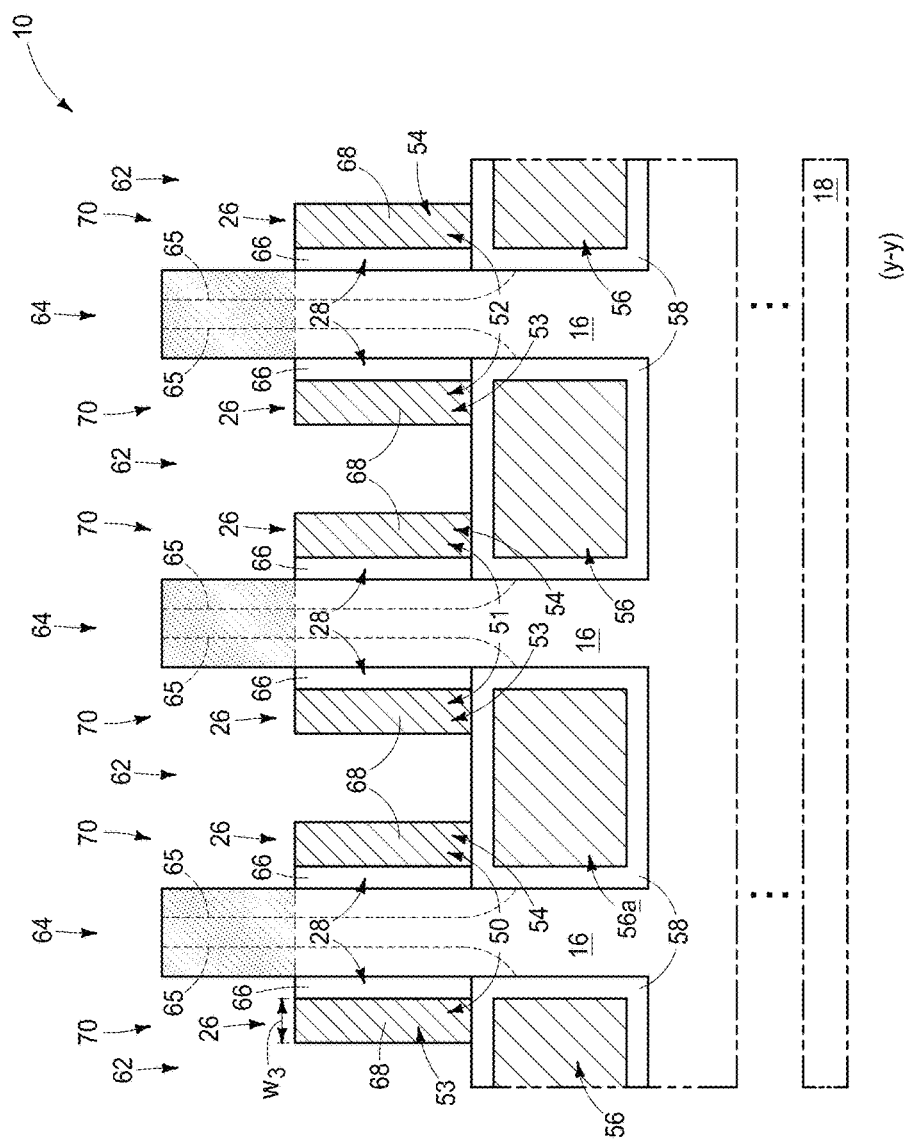

Referring to FIG. 8, spacers 70 (FIG. 7) are utilized as a mask during an etch of wordline material 68. Such divides the wordline material into the wordlines 26. The wordlines 26 are within the pairs 50-52 described above with reference to FIGS. 1-4. Each of the pairs comprises the first wordline 53 and the second wordline 54. Notably, two wordlines are over each of the conductive beams 56, with one of the wordlines being from a first wordline pair and the other being from a second wordline pair adjacent the first wordline pair. For instance, one of the beams is labeled 56a in FIG. 8. A second wordline 54 of the wordline pair 50 is over the beam 56a, and a first wordline 53 of the wordline pair 51 is also over the beam 56a.

After the wordline material 68 is split into wordlines 26, the spacers 70 (FIG. 7) may be removed. In the illustrated embodiment, the insulative material 66 along upper surfaces of rails 64 is also removed.

The rails 64 are shown as being rectangular in the diagram of FIG. 8. It is noted that the rails 64 may have other shapes in actual practice. For instance, dashed lines 65 are provided within the semiconductor material 16 of rails 64 to diagrammatically illustrate a possible shape of the rails in some embodiments. Specifically, upper portions of the rails are thinner than lower portions of the rails. The upper portions may be thinned due to dielectric material 66 being grown along such upper portions and/or due to other processing.

Fins 14 of finFET devices 12 are eventually patterned from the rails 64 (as described below with reference to subsequent processing stages). The wordlines 26 advantageously support the rails 64 (and also fins formed from the rails 64), which may alleviate or prevent toppling issues associated with conventional methods of forming finFETs. Specifically, in conventional methods the fins of finFET devices may be fabricated before the wordlines adjacent such fins. The provision of the wordlines 26 along the rails 64 may provide structural support to the rails, and the fins ultimately patterned from such rails, which improves structural integrity relative to the unsupported fins of conventional methods.

The wordlines 26 have widths $W_3$. Such widths may be of any suitable dimension, including, for example, F/2, F/4, F/6, etc.

Figure 9:
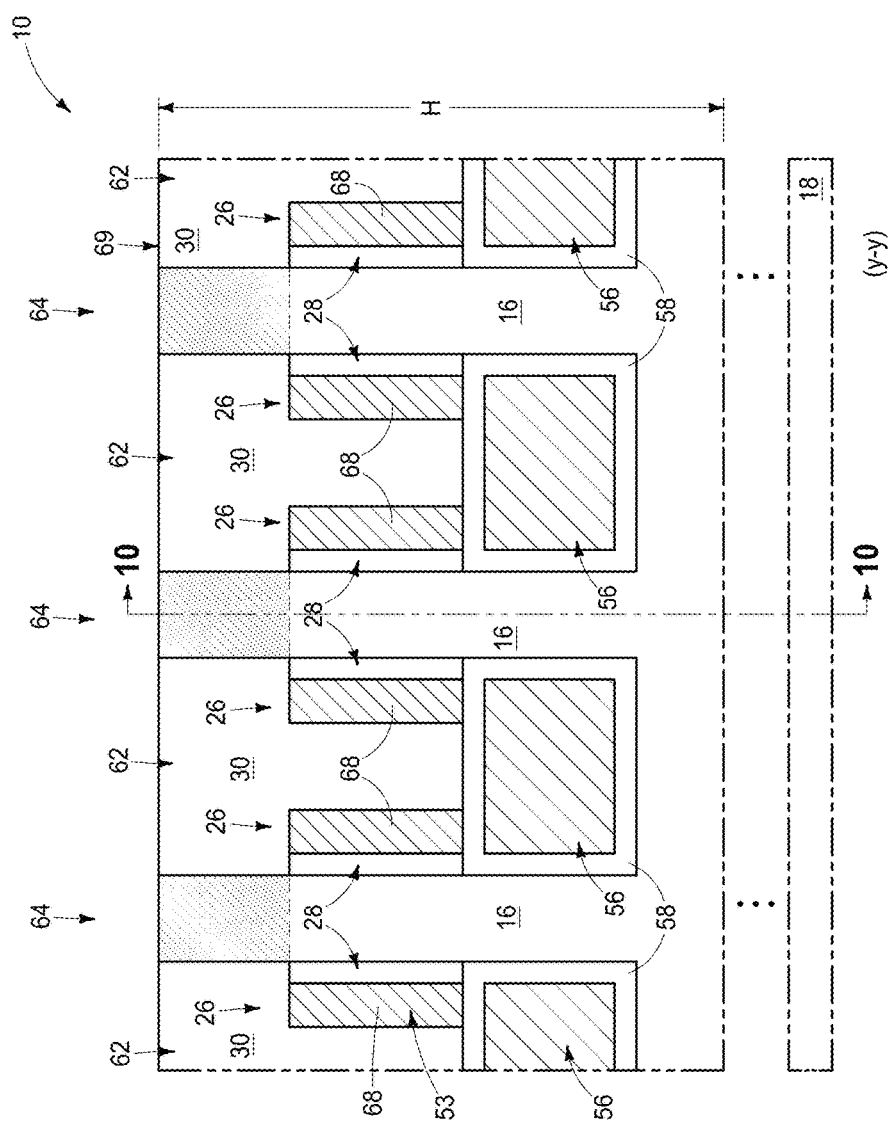

Referring to FIG. 9, dielectric material 30 is provided within the trenches 62 between the rails 64. The construction 10 may then be subjected to planarization (for instance, chemical-mechanical polishing) to form the planarized upper surface 69.

Figure 10:
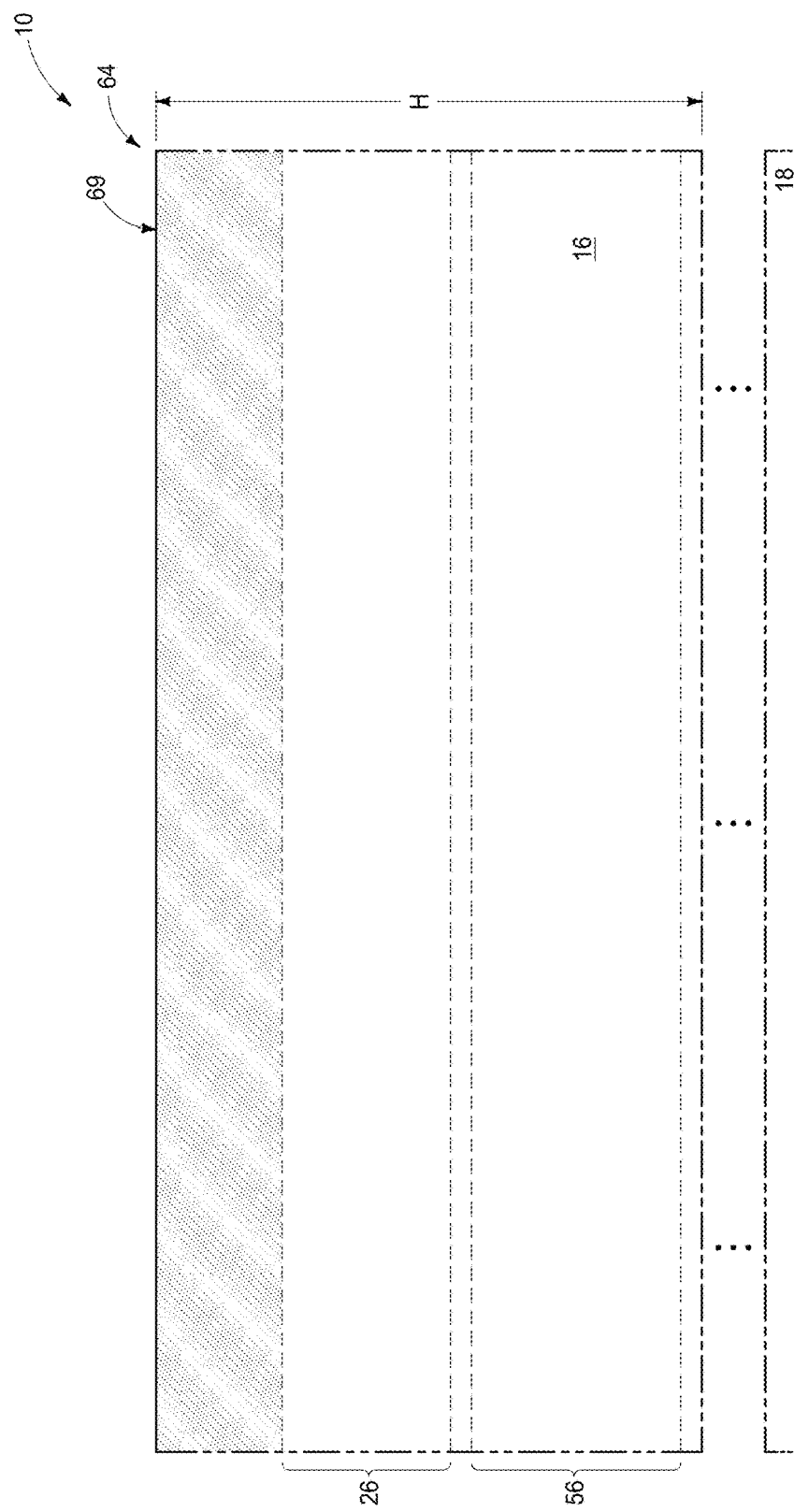
FIG. 10 is a diagrammatic cross-sectional side view of the construction of FIG. 9 at the same processing stage as FIG. 9, but along the same plane as the cross-section section X-X of FIG. 1. The view of FIG. 10 is along the line 10-10 of FIG. 9.

Referring to FIG. 10, the construction 10 is shown along the plane X-X of FIG. 1 (i.e., the same plane as FIG. 2). FIG. 10 shows the same processing stage as FIG. 9, and is along one of the rails 64; with the view of FIG. 10 being along the line 10-10 of FIG. 9.

The construction 10 has a height "H" at the processing stage of FIGS. 9 and 10, with such height being equivalent to a height illustrated in FIG. 2 as being the height to the bottom surfaces of digit lines 34.

Figure 11:
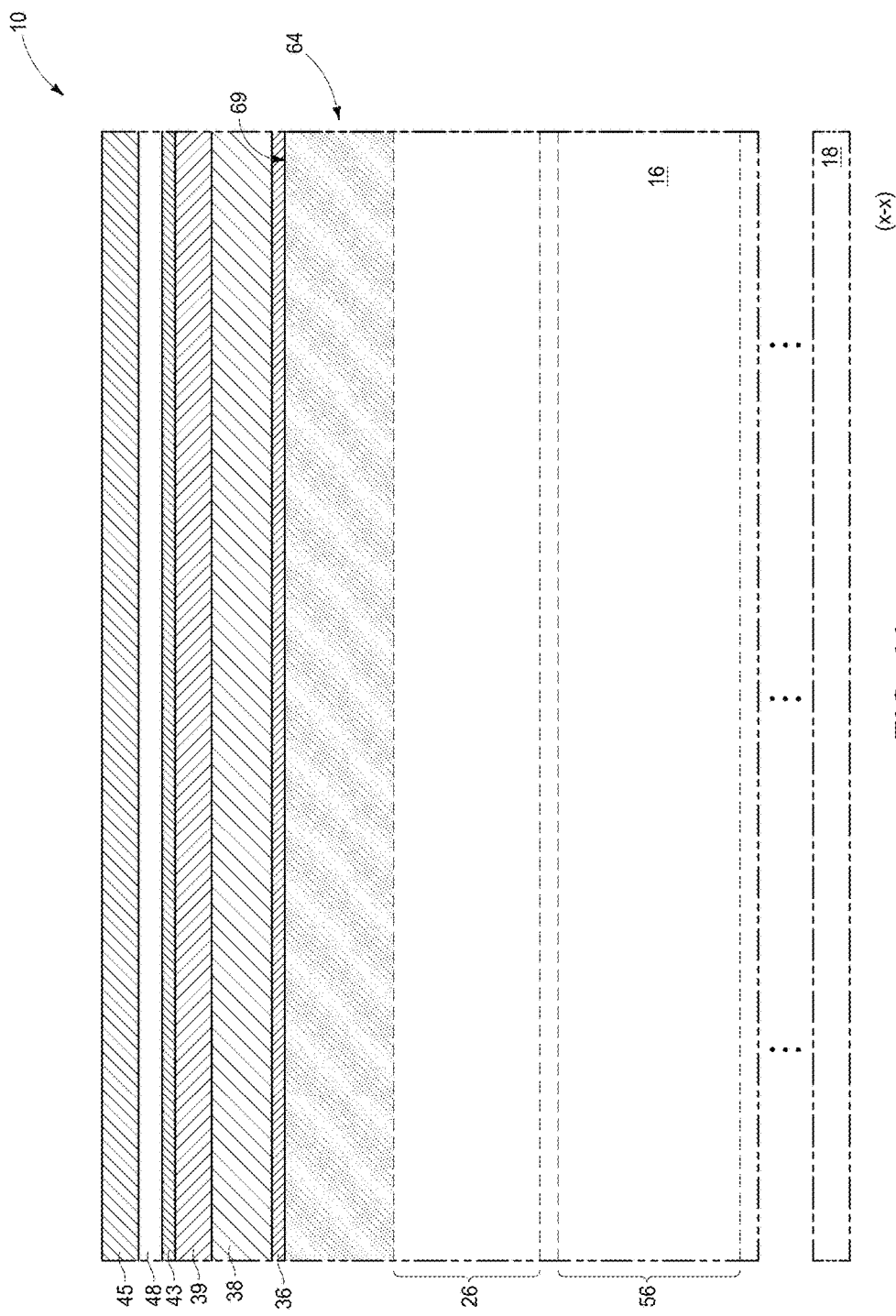
FIGS. 11-18 show the construction of FIGS. 5-10 at additional stages of the example method of forming the memory array.
Figure 12:
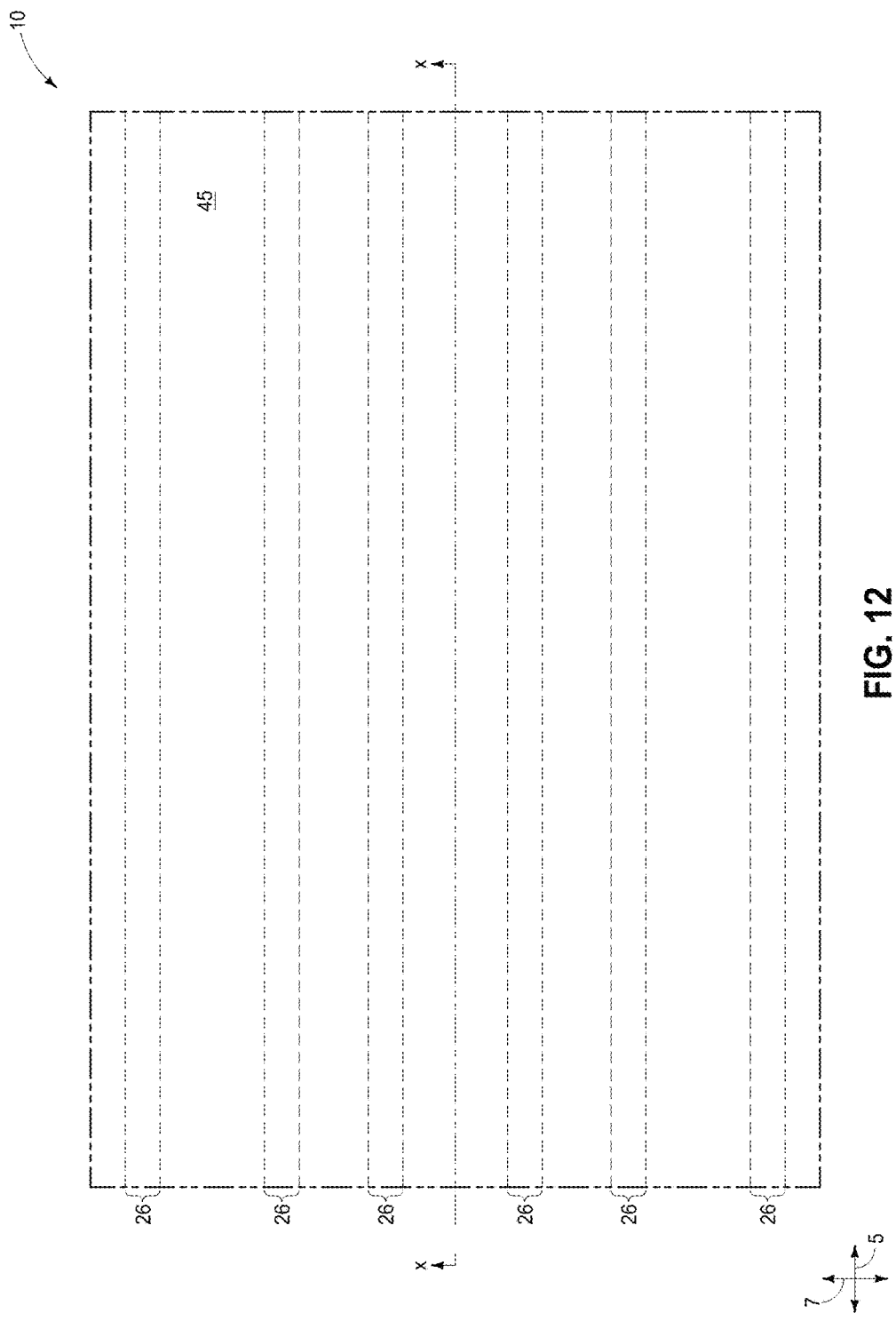

Referring to FIGS. 11 and 12 (with FIG. 12 being a top view of the construction of FIG. 11, and FIG. 11 being along the line X-X of FIG. 12), the materials 36, 38, 39, 43, 48 and 45 are formed over the planarized upper surface 69. In some embodiments the materials 43, 45 and 48 may be referred to as capacitor materials (or as charge-storage device materials); and the materials 36 and 38 may be referred to as digit line materials. The embodiment of FIGS. 11 and 12 is an example embodiment, and in other embodiments there may be other digit line materials and/or other capacitor materials (or other charge-storage device materials) besides, or alternatively to, those illustrated. Generally, there may be at least one digit line material, and there may be at least one capacitor material (or at least one charge-storage device material). The materials 36, 38, 39, 43, 48 and 45 may be together considered to be comprised by an expanse formed across the rails 64 of semiconductor material 16.

Figure 13:
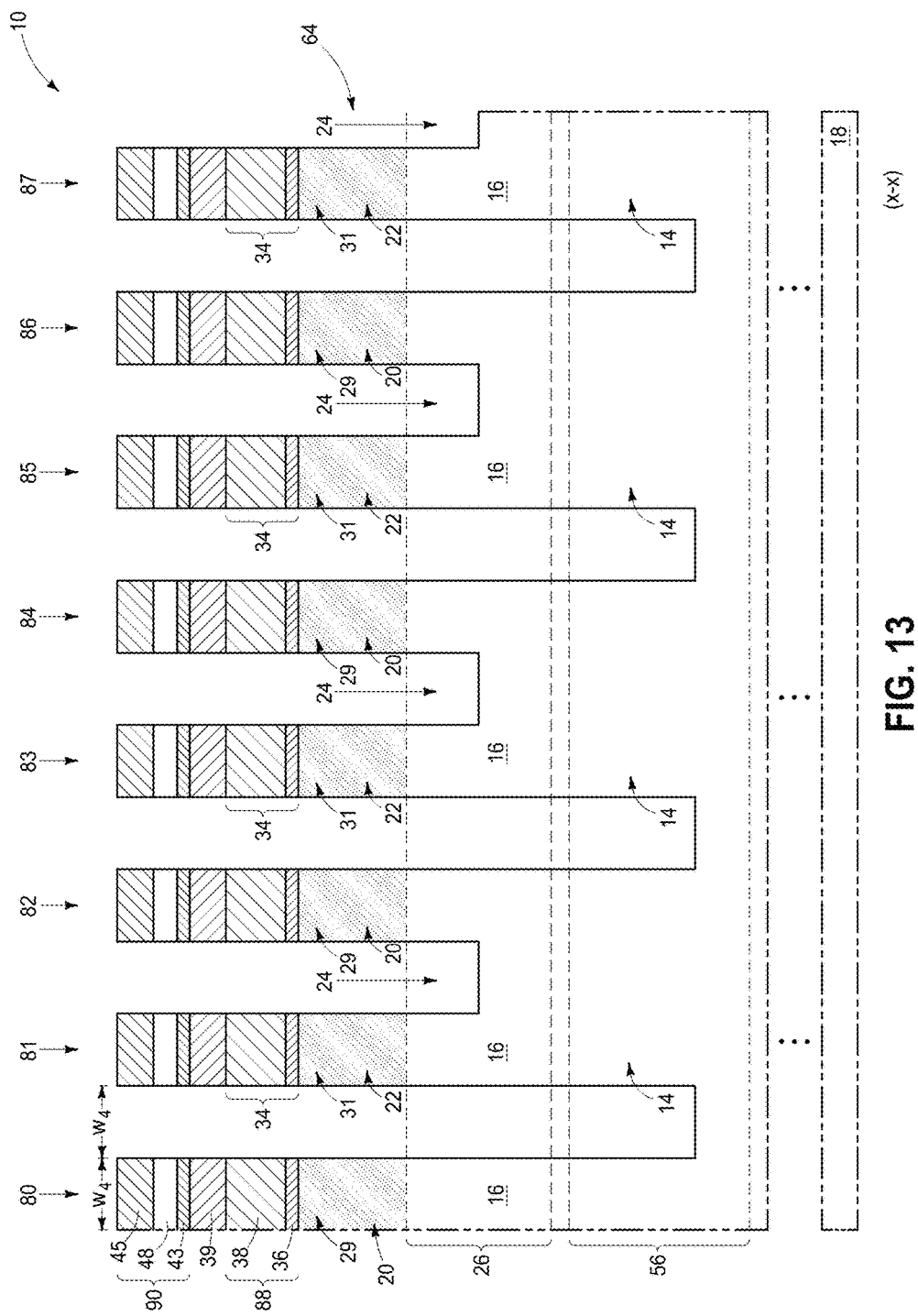
Figure 14:
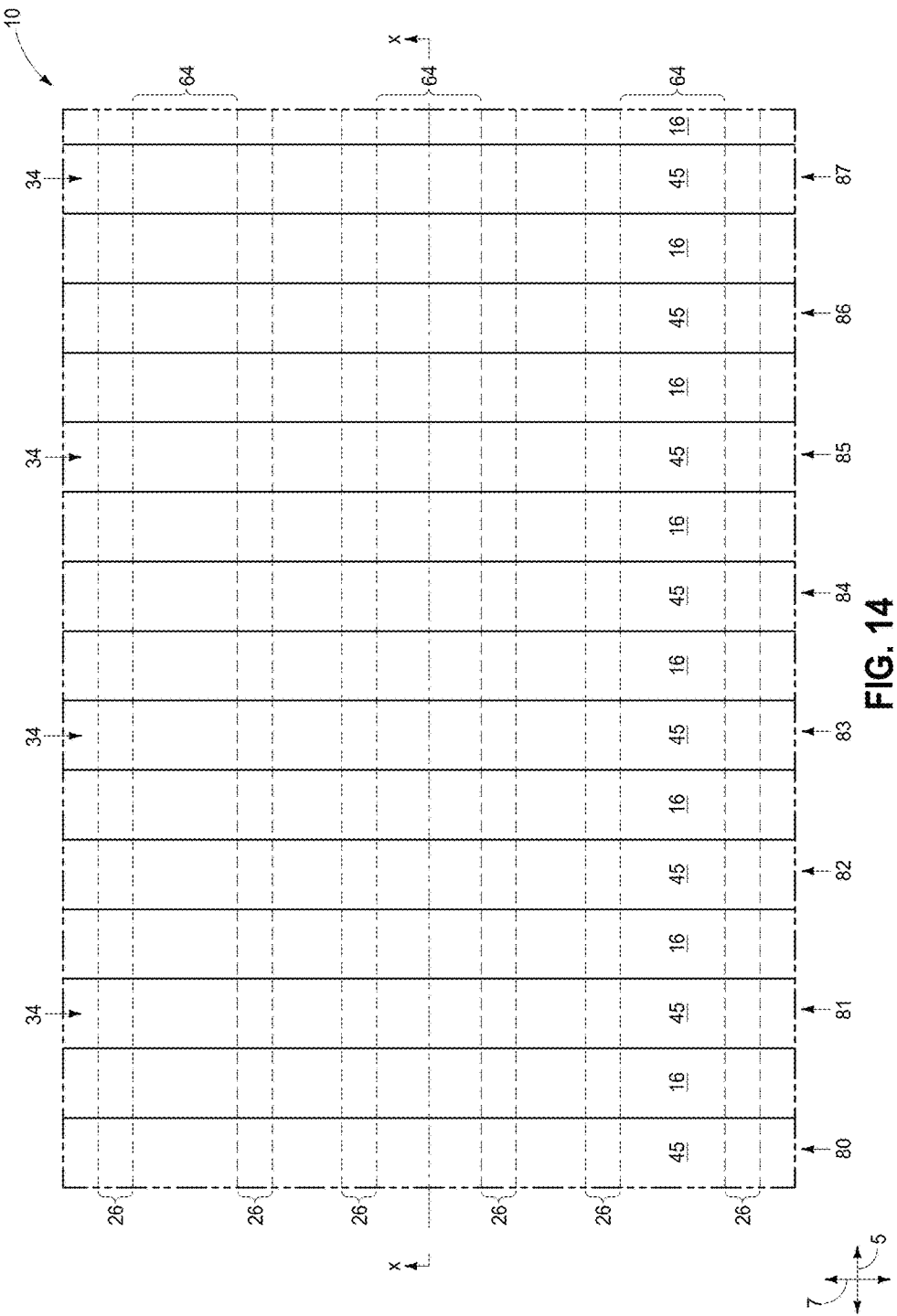

Referring to FIGS. 13 and 14 (with FIG. 14 being a top view of the construction of FIG. 13, and FIG. 13 being along the line X-X of FIG. 14), the semiconductor rails 64 are patterned to form a plurality of fins 14. Also, the illustrated digit line materials 36/38 and capacitor materials 43/45/48 are formed into lines 80-87 with the same pattern utilized to form the fins 14. In some embodiments the lines 80-87 may be referred to as linear structures; with the lines 81, 83, 85 and 87 corresponding to first linear structures, and the lines 80, 82, 84 and 86 corresponding to second linear structures. The first and second linear structures alternate with one another along the direction of axis 5. The slicing of the materials 36/38/43/45/48 into lines 80-87 and the patterning of the rails 64 into fins 14 may be accomplished utilizing a patterned mask (not shown) and one or more suitable etches to extend a pattern from the mask through the materials 36/38/43/45/48 and into the semiconductor material 16 of the rails 64.

In some embodiments the digit line materials 36/38 may be considered to form digit line structures 88 within lower regions of the lines 80-87, and the capacitor materials 43/48/45 may be considered to form capacitor-material structures 90 within upper regions of the lines 80-87. The digit line materials within lines 81, 83, 85 and 87 correspond to digit lines 34 of the type described above with reference to FIGS. 1-4.

Each of the fins 14 comprises a first pedestal 20, a second pedestal 22, and a trough 24 between the first and second pedestals. In the shown embodiment, the first and second pedestals 20/22 comprise the heavily-doped source/drain regions 29/31 as the first and second pedestals 20/22 are patterned from the rail 64, due to the heavy doping having been provided in the semiconductor material 16 of the rail prior to patterning the rail into the pedestals. In other embodiments at least some of the dopant of the heavily-doped source/drain region 29/31 may be formed with one or more implants subsequent to the patterning of the first and second pedestals 20/22 from the rail 64.

The pedestals 20/22 have widths $W_4$ along the cross-section of FIG. 13, and spaces (i.e., gaps) between the pedestals also have widths $W_4$. Such widths $W_4$ may be of any suitable dimension, such as, for example, F/2, F/4, F/6, etc. In the illustrated embodiment the pitch along the cross-section of FIG. 13 is $2W_4$.

Figure 15:
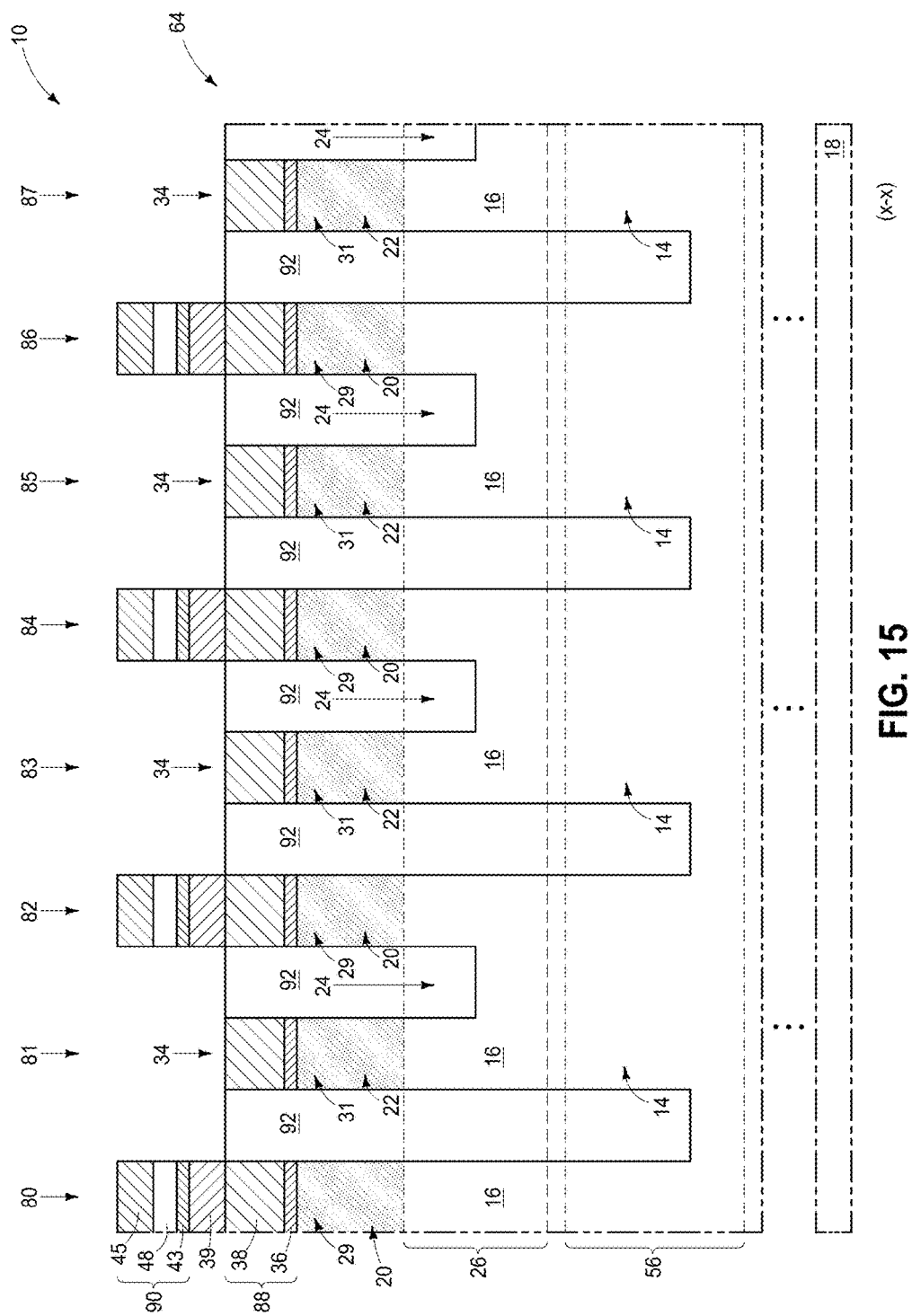
Figure 16:
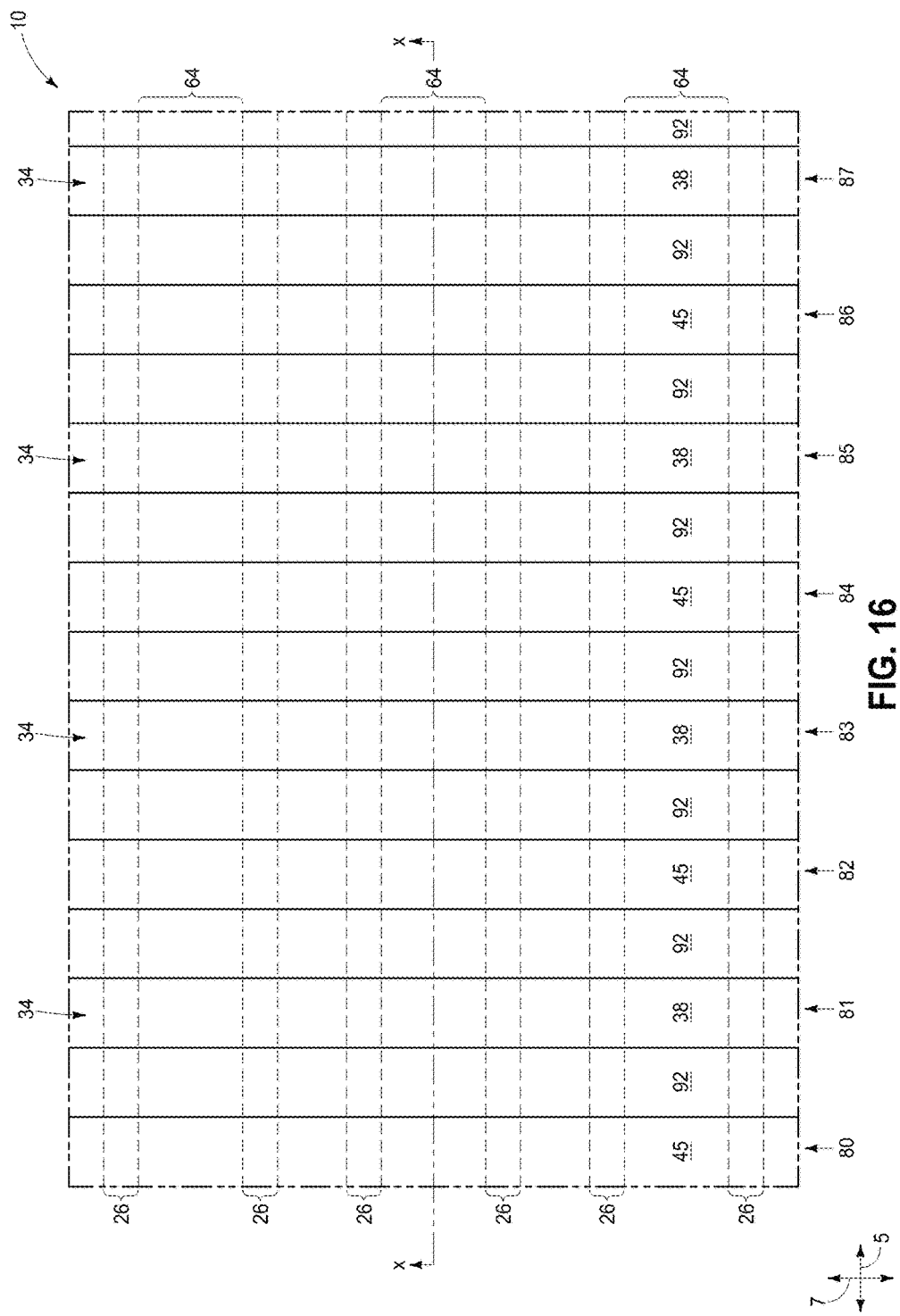

Referring to FIGS. 15 and 16 (with FIG. 16 being a top view of the construction of FIG. 15, and FIG. 15 being along the line X-X of FIG. 16), insulative material 92 is formed between the fins 14, and also within the troughs 24 of the fins. The insulative material 92 may comprise any suitable composition or combination of compositions including, for example, silicon nitride, silicon dioxide, etc.

The conductive materials 39, 43, 48 and 45 are removed from conductive lines 81, 83, 85 and 87 to leave the digit lines 34.

Figure 17:
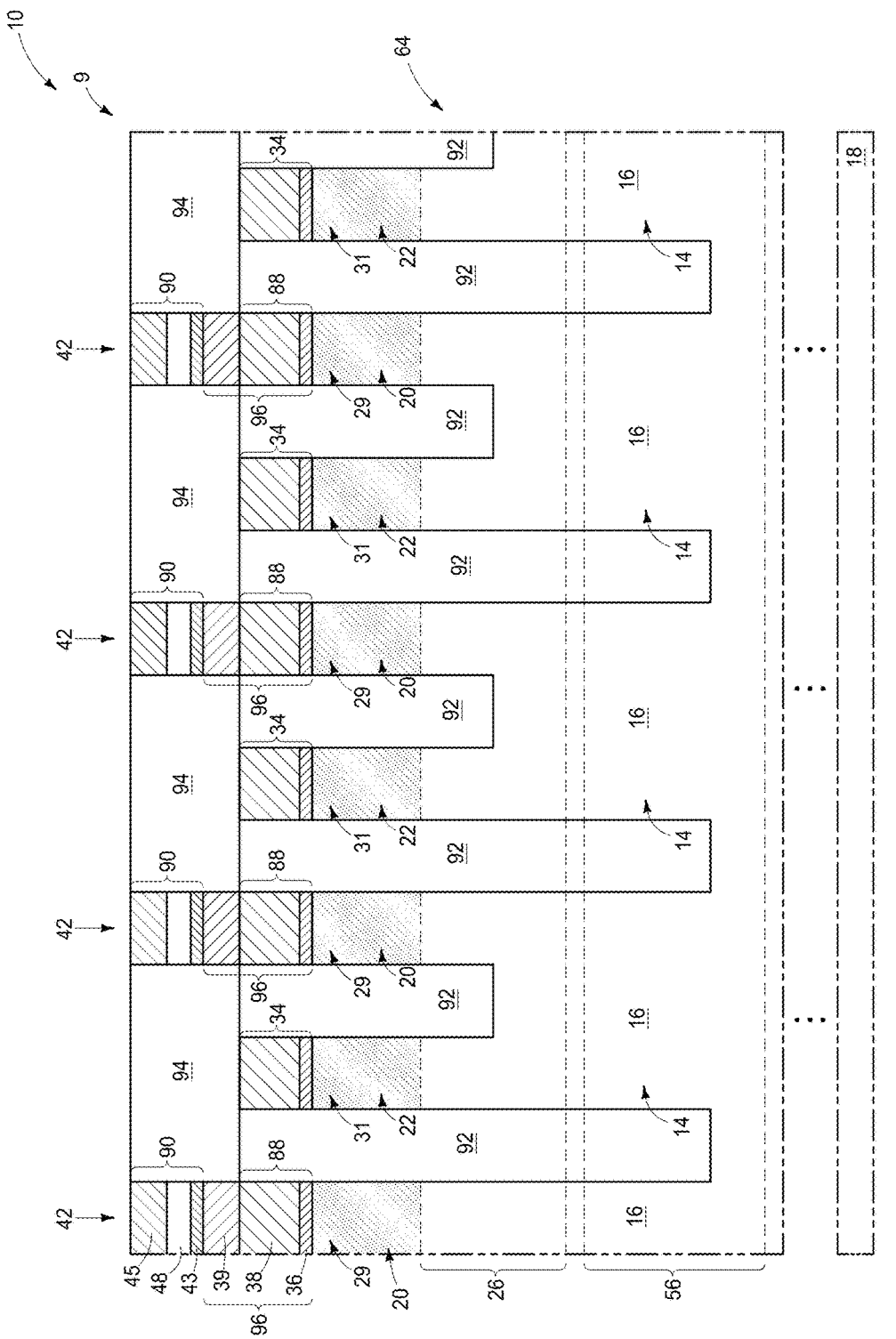
Figure 18:
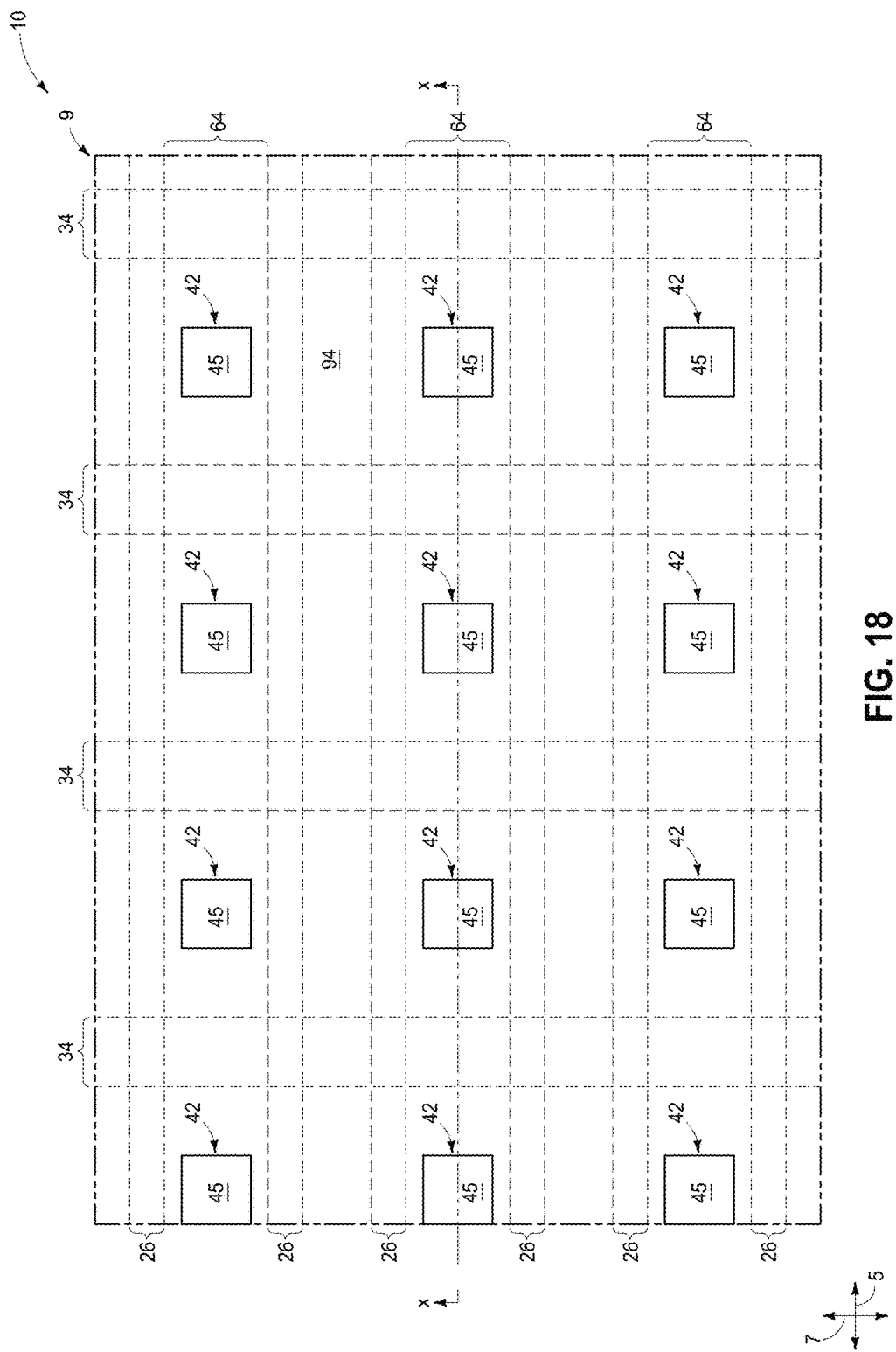

Referring to FIGS. 17 and 18 (with FIG. 18 being a top view of the construction of FIG. 17, and FIG. 17 being along the line X-X of FIG. 18), the second linear structures 80, 82, 84 and 86 (FIGS. 15 and 16) are divided along the direction of axis 7 to slice the capacitor-material structures 90 into capacitors 42 (i.e., to singulate the capacitors 42 from the capacitor-material structures 90), and to divide the digit line material structures 88 and conductive material 39 into conductive interconnects 96 that electrically couple the capacitors 42 with the source/drain regions 29 within the second pedestals 22.

Insulative material 94 is formed over digit lines 34, and along the conductive interconnects 96 and capacitors 42. The insulative material 94 may comprise any suitable composition or combination of compositions including, for example, silicon nitride, silicon dioxide, etc. The insulative material 94 may be a same composition as insulative material 92, or may be a different composition than insulative material 92.

The construction 10 of FIGS. 17 and 18 comprises a memory array 9 of the type described above with reference to FIGS. 1-4. Although the construction 10 of FIGS. 17 and 18 comprises insulative materials 92/94 instead of specifically indicating the insulative material 30 of FIGS. 1-4, it is to be understood that the insulative materials 92/94 may correspond to the material 30 of FIGS. 1-4.

An advantage of the process of FIGS. 5-18 is that such supports fins 14 with the wordlines 26 as the fins are formed (discussed above with reference to FIG. 8). Another advantage of the process of FIGS. 5-18 is that such forms the digit lines 34 to be recessed below the capacitors 42 (e.g., uppermost surfaces of the digit lines 34 are beneath lowermost surfaces of capacitor node 43), which may enable the footprint of the capacitors to be extended to over the digit lines in some embodiments. Such may enable larger footprints for the capacitors relative to architectures which do not have the recessed digit lines, and may provide additional tolerance for mask misalignment during fabrication of the capacitors.

Figure 19:
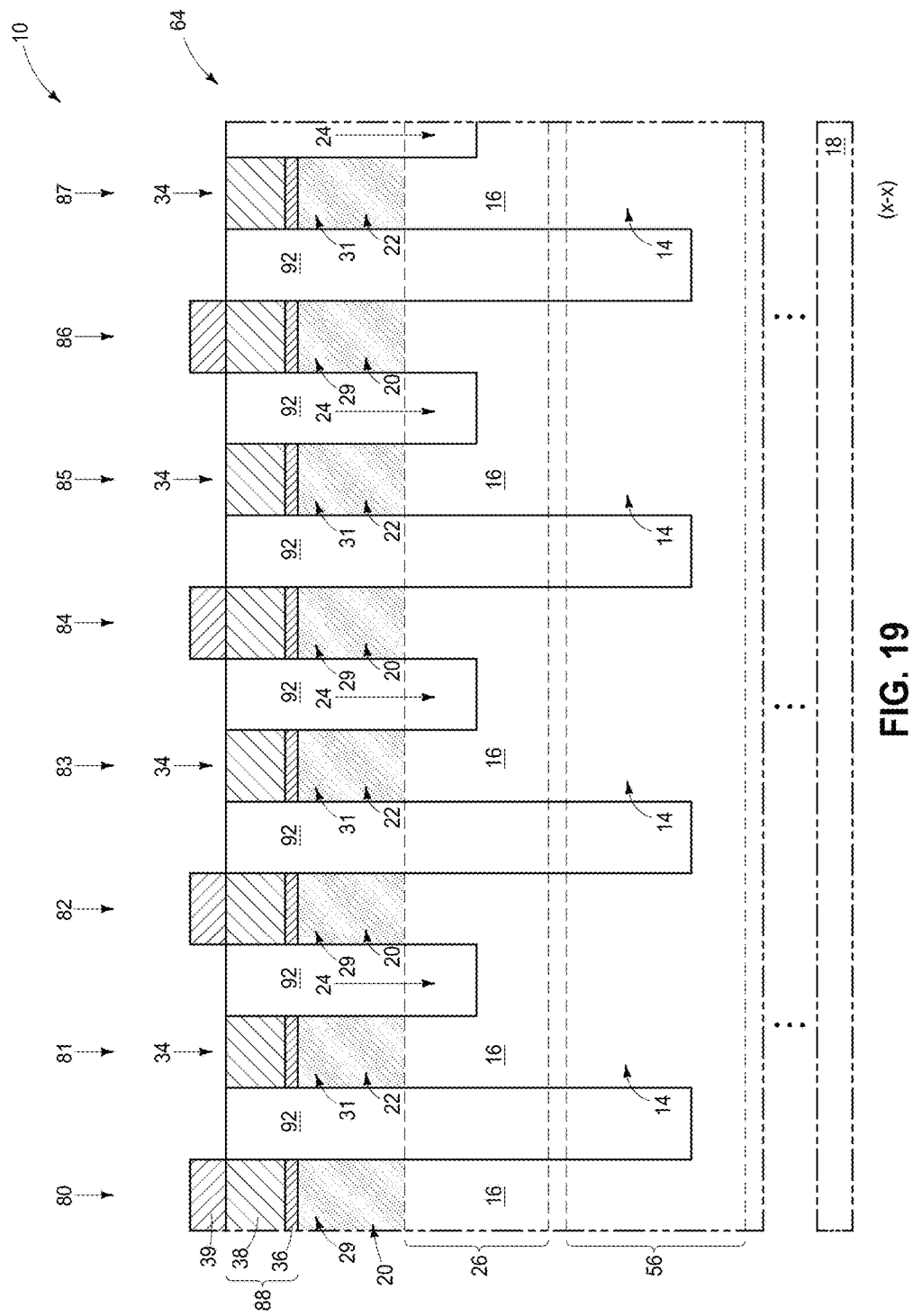
FIGS. 19-21 show another example method of forming a memory array.
Figure 20:
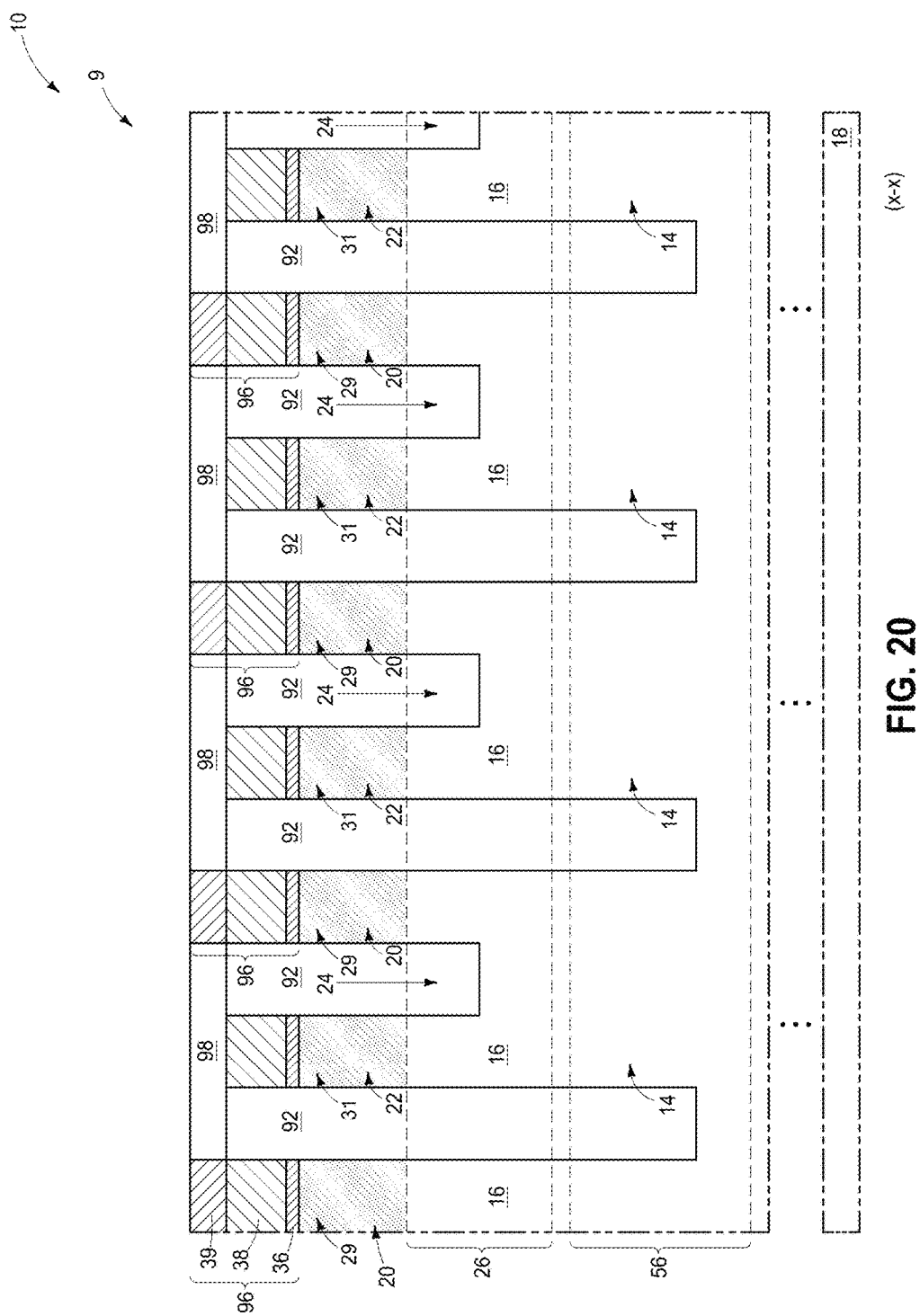
Figure 21:
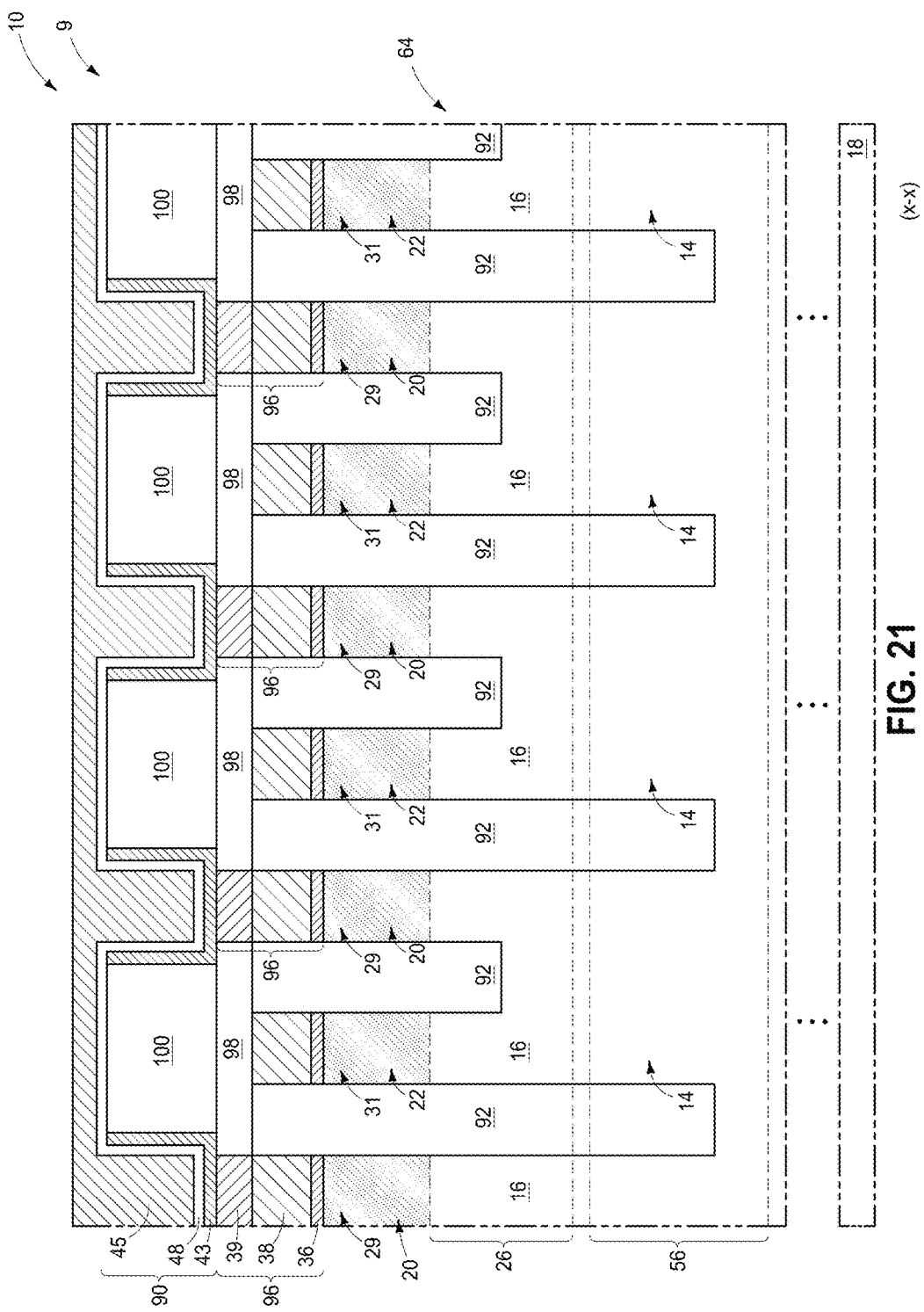

Referring now to FIGS. 19 through 21, another example method will be described. In accordance with the process steps as described with reference to FIGS. 5-15, an intermediate structure as shown FIG. 19 is obtained; however, it should be noted that in this method, the capacitor materials 43/45/48 are not formed as is apparent from comparison between FIG. 15 and FIG. 19.

Referring to FIG. 20, the insulative material 98 is formed over the insulative material 92 and then planarized by, for instance, chemical-mechanical polishing (CMP) to expose the upper surface of each material 39. The insulative material 98 may comprise any suitable composition or combination of compositions including, for example, silicon nitride, silicon dioxide, etc. In this processing stage, conductive interconnects 96 as a capacitor contact plug includes the electrically conductive materials 36 and 38 that are also used as a bitline or digit line.

Referring to FIG. 21, the charge-storage devices 90 (such as a capacitor), are formed. More specifically, insulative material 100 is formed over the insulative material 98 and the material 39. The insulative material 100 may comprise any suitable composition or combination of compositions including, for example, silicon nitride, silicon dioxide, etc. Openings are then selectively formed in the insulative material 100 to expose at least a part of the materials 39, and conductive electrode material 43 is formed conformally into the respective openings to form a lower electrode of each capacitor (charge-storage device). The conductive electrode material 43 can be deposited using conventional methods, such as chemical vapor deposition (CVD), or physical vapor deposition (e.g., sputtering) for a conductive metal. A thin film of capacitor dielectric material 48 is formed conformally over the surface of the conductive electrode material 43 and the insulative material 100, typically by CVD or atomic layer deposition (ALD). Conductive electrode material 45 is then formed over the capacitor dielectric material 48 to form the top (upper) capacitor plate electrode. While the capacitor shown in FIG. 21 is of a cylindrical type, any other types such as a crown type may be formed.

The structures and memory arrays discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

Both of the terms "dielectric" and "electrically insulative" may be utilized to describe materials having electrically insulative electrical properties. The terms are considered synonymous in this disclosure. The utilization of the term "dielectric" in some instances, and the term "electrically insulative" in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, unless specifically stated otherwise, in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some embodiments include a method of forming a memory array. A wordline is formed to extend along a first direction, and along a rail of semiconductor material. After the wordline is formed, fins are patterned from the rail. Each fin has a first pedestal, a second pedestal, and a trough between the first and second pedestals. Charge-storage devices are formed to be electrically coupled with the first pedestals. Digit lines are formed to be electrically coupled with the second pedestals.

Some embodiments include a method of forming a memory array. A pair of wordlines is formed to extend along a first direction, and the wordlines of said pair are spaced from one another by a rail of semiconductor material. At least one digit line material is formed over the rail of semiconductor material. The at least one digit line material is sliced into digit lines with a pattern, and the same pattern is utilized to during etching into the rail to form fins. Each fin has a first pedestal, a second pedestal, and a trough between the first and second pedestals. The digit lines are electrically coupled with the second pedestals. Capacitors are formed to be electrically coupled with the first pedestals.

Some embodiments include a method of forming a memory array. A plurality of wordline pairs are formed to extend along a first direction and along rails of semiconductor material. Each wordline pair comprises a first wordline and a second wordline. The first and second wordlines of each of the wordline pairs are spaced from one another by one of the rails of semiconductor material. An expanse is formed to extend across the rails of semiconductor material. The expanse comprises at least one digit line material. The expanse is sliced into a plurality of linear structures which comprise the at least one digit line material. The linear structures alternate between first linear structures and second linear structures. The first linear structures are digit lines. The slicing utilizes a pattern, and the same pattern is used during etching into the rails to form fins. Each fin has a first pedestal, a second pedestal, and a trough between the first and second pedestals. The digit lines are electrically coupled with the second pedestals. The at least one digit line material of the second linear structures is divided into conductive interconnects electrically coupled with the first pedestals. Capacitors are formed to be electrically coupled with the conductive interconnects.

Some embodiments include an apparatus which comprises a plurality of finFETs, at least one bitline, a plurality of storage devices, and a plurality of contact plugs. Each of the finFETs comprises a first pedestal serving as a first source/drain region, a second pedestal serving as a second source/drain region and a trough defining a channel region between the first and second source/drain regions. The at least one bitline extends to interconnect the first source/drain regions of the plurality of finFETs to each other and comprises a plurality of first portions and a plurality of second portions. Each of the plurality of first portions is in contact with an associated one of the first source/drain regions of the plurality of finFETs, and each of the plurality of second portions intervenes between corresponding adjacent two of the plurality of first portions. Each the plurality of second portions comprises a first conductive material. Each of the plurality of contact plugs intervenes between an associated one of the plurality of storage devices and an associated one of the second source/drain regions of the plurality of finFETs and comprises the first conductive material that is used in each of the plurality of second portions of the at least one bitline.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A method of forming a memory array, comprising:
    forming a conductive wordline extending along a first direction, and along a rail of semiconductor material;
    after forming the conductive wordline, patterning fins from the rail; each fin having a first pedestal, a second pedestal, and a trough between the first and second pedestals;
    forming digit lines electrically coupled with the second pedestals; and
    forming charge-storage devices electrically coupled with the first pedestals.

2. The method of claim 1 wherein the conductive wordline is over a conductive beam and is spaced from the conductive beam by dielectric material.

3. The method of claim 2 wherein the conductive wordline comprises metal, and wherein the conductive beam consists of conductively-doped silicon.

4. The method of claim 1 wherein digit line material is formed over the rail prior to patterning the fins from the rail; and wherein the digit line material is patterned into the digit lines with a same pattern utilized to pattern the fins from the rail.

5. The method of claim 1 wherein the conductive wordline is one of a pair of conductive wordlines formed on opposing sides of the rail of semiconductor material.

6. The method of claim 1 wherein the rail of semiconductor material has a doped upper region; and wherein said doped upper region becomes first source/drain regions in the first pedestals and second source/drain regions in the second pedestals.

7. The method of claim 1 further comprising forming a conductive beam extending beneath the conductive wordline.

8. The method of claim 7 wherein the conductive beam comprises a conductive material different from the conductive material of the conductive wordline.

9. A method of forming a memory array, comprising:
    forming a pair of conductive wordlines extending along a first direction, and spaced from one another by a rail of semiconductor material;
    forming at least one digit line material over the rail of semiconductor material;
    slicing the at least one digit line material into digit lines with a pattern, and after the forming of the pair of the conductive wordlines, utilizing the same pattern during etching into the rail to form fins; each fin having a first pedestal, a second pedestal, and a trough between the first and second pedestals; the digit lines being electrically coupled with the second pedestals; and
    forming capacitors electrically coupled with the first pedestals.

10. The method of claim 9 wherein slicing the at least one digit line material into digit lines with a pattern includes slicing the digit line material into conductive interconnects with the pattern.

11. The method of claim 9 wherein the at least one digit line material includes a metal-containing composition over conductively-doped silicon.

12. The method of claim 9 wherein the conductive wordlines are over conductive beams, and are spaced from the conductive beams by dielectric material.

13. The method of claim 9 wherein the rail of semiconductor material has a heavily doped upper region; and wherein said heavily-doped upper region becomes first source/drain regions in the first pedestals and second source/drain regions in the second pedestals.

14. The method of claim 9 further comprising forming a conductive beam extending beneath at least one of the conductive wordlines.

15. The method of claim 14 wherein the conductive beam comprises a conductive material different from the conductive material of the at least one conductive wordline.

16. A method of forming a memory array, comprising:
forming a plurality of conductive wordline pairs extending along a first direction and along rails of semiconductor material; each conductive wordline pair comprising a first conductive wordline and a second conductive wordline; the first and second conductive wordlines of each of the conductive wordline pairs being spaced from one another by one of the rails of semiconductor material;
forming an expanse extending across the rails of semiconductor material; the expanse comprising at least one digit line material;
slicing the expanse into a plurality of linear structures comprising the at least one digit line material; the linear structures alternating between first linear structures and second linear structures; the first linear structures being digit lines; the slicing utilizing a pattern, and after the forming of the plurality of the conductive wordline pairs, the same pattern being used during etching into the rails to form fins; each fin having a first pedestal, a second pedestal, and a trough between the first and second pedestals; the digit lines being electrically coupled with the second pedestals;
dividing the at least one digit line material of the second linear structures into conductive interconnects electrically coupled with the first pedestals; and
forming capacitors electrically coupled with the conductive interconnects.

17. The method of claim 16 wherein:
capacitor materials are included within the expanse, and are over the at least one digit line material;
the capacitor materials are included within the first and second linear structures;
the capacitor materials are removed from the first linear structures; and
the capacitors materials of the second linear structures are divided into the capacitors while the at least one digit line material of the second linear structures is divided into the conductive interconnects.

18. The method of claim 16 further comprising forming a conductive beam extending beneath at least one of the conductive wordlines of the plurality of conductive wordline pairs.

19. The method of claim 18 wherein the conductive beam comprises a conductive material different from the conductive material of the at least one of the conductive wordlines of the plurality of conductive wordline pairs.

* * * * *